United States Patent [19]

Hamisch, Jr. et al.

[11] Patent Number: 4,498,947
[45] Date of Patent: Feb. 12, 1985

[54] HAND-HELD LABELER

[75] Inventors: Paul H. Hamisch, Jr., Franklin; James A. Makley, Dayton, both of Ohio

[73] Assignee: Monarch Marking Systems, Inc., Dayton, Ohio

[21] Appl. No.: 582,339

[22] Filed: Feb. 28, 1984

[51] Int. Cl.³ .............................................. B65C 11/02
[52] U.S. Cl. .................................. 156/384; 101/288; 156/541; 156/577; 156/579; 156/584; 156/DIG. 49
[58] Field of Search ............... 156/381, 541, 577, 579, 156/584, DIG. 48, DIG. 49; 101/288

[56] References Cited

U.S. PATENT DOCUMENTS

| 4,264,396 | 4/1981 | Stewart | 156/361 |
| 4,407,692 | 10/1983 | Torbeck | 156/384 |
| 4,439,257 | 3/1984 | Sato et al. | 156/577 |
| 4,477,305 | 10/1984 | Hamisch | 156/384 |

Primary Examiner—Michael Wityshyn
Attorney, Agent, or Firm—Joseph J. Grass

[57] ABSTRACT

There is disclosed a hand-held labeler with a thermographic print head for printing on labels releasably secured to a carrier web, a delaminator for delaminating printed labels, an applicator for applying printed labels, a web feeding mechanism including an electric motor for advancing the carrier web, a detachable handle containing a source of electrical energy, and circuitry including a plurality of printed circuit boards electrically connecting the electrical energy source, the keyboard and the print head.

20 Claims, 25 Drawing Figures

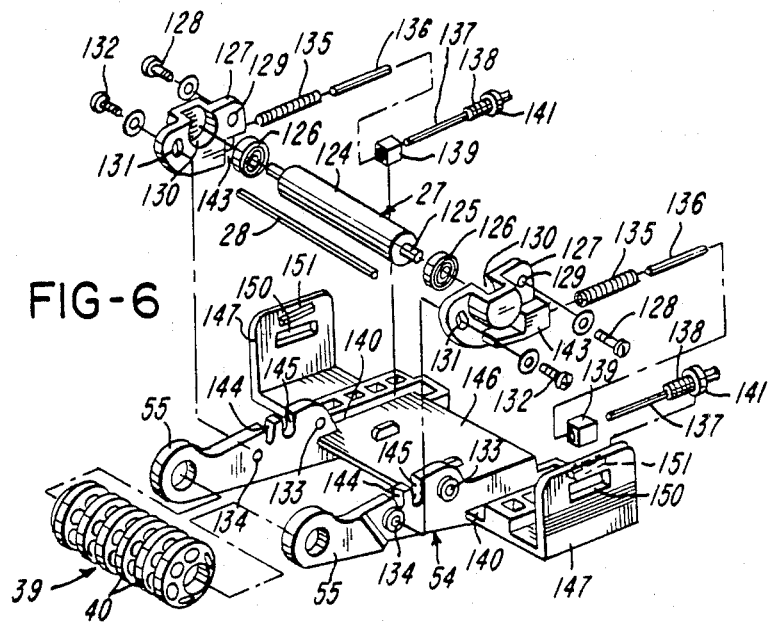
FIG-6
FIG-7
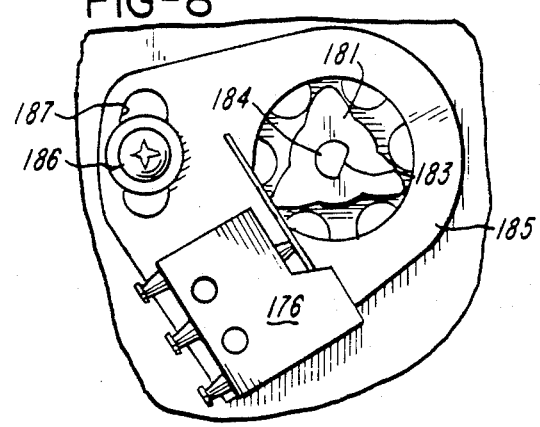
FIG-8

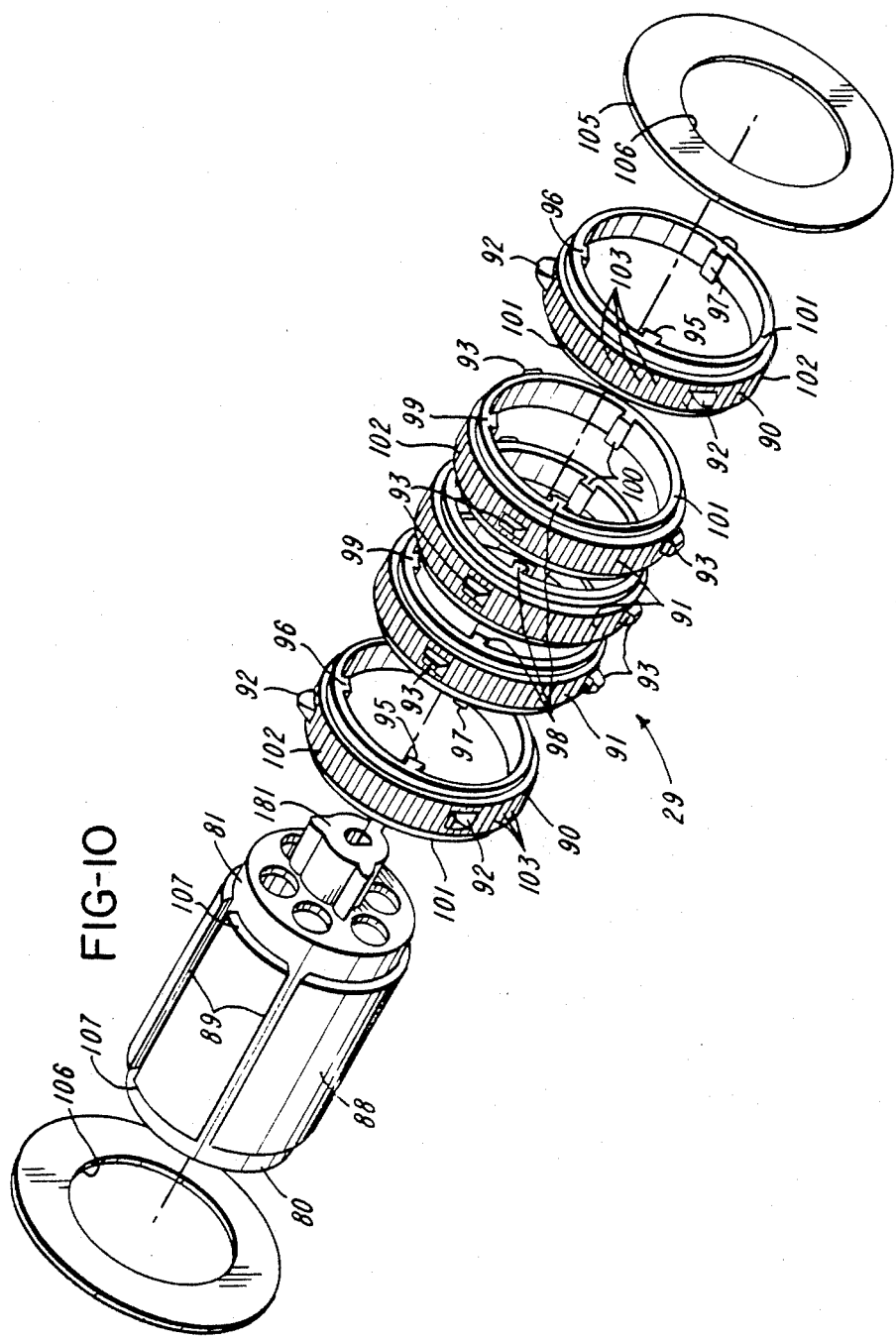

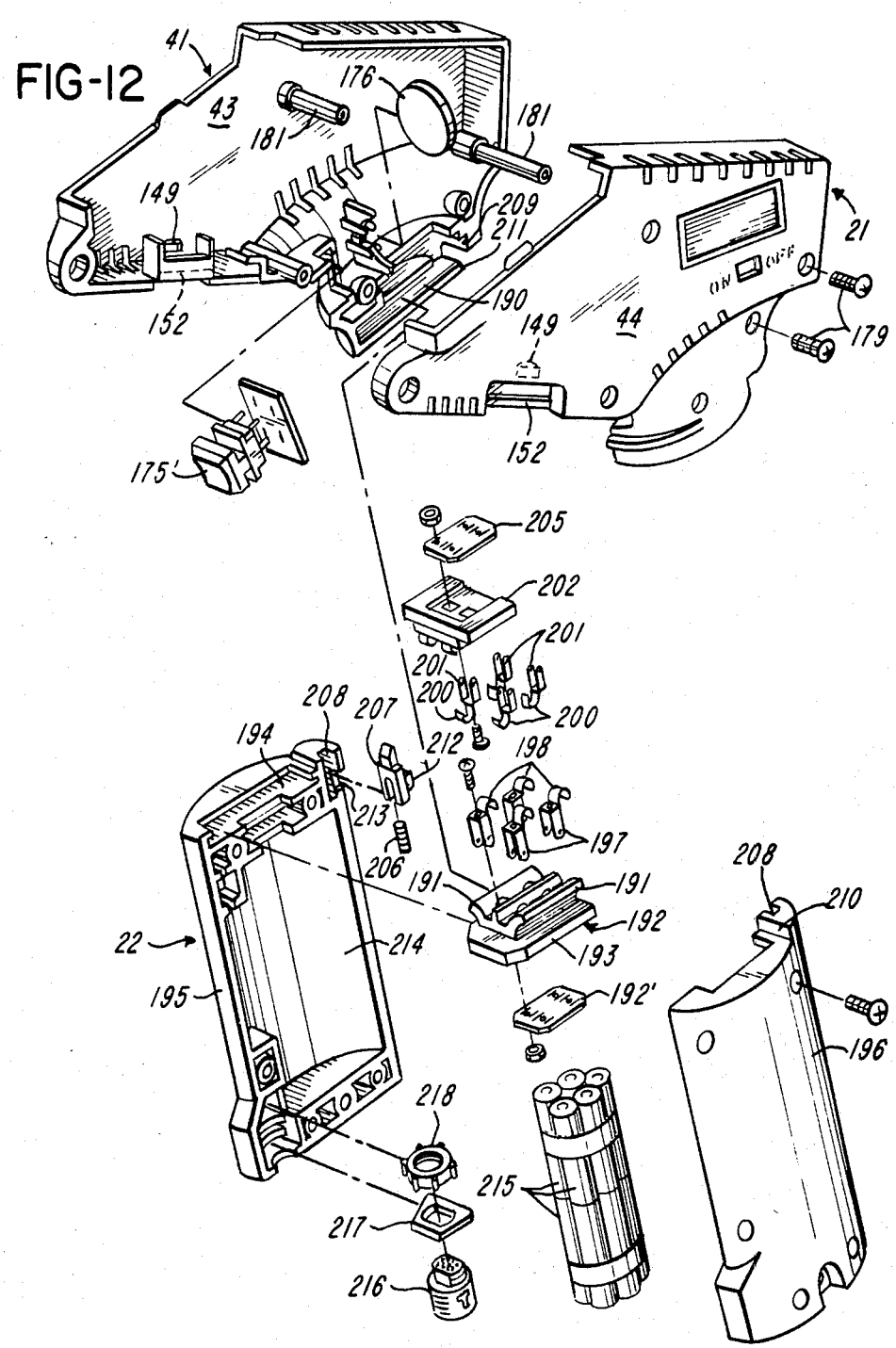

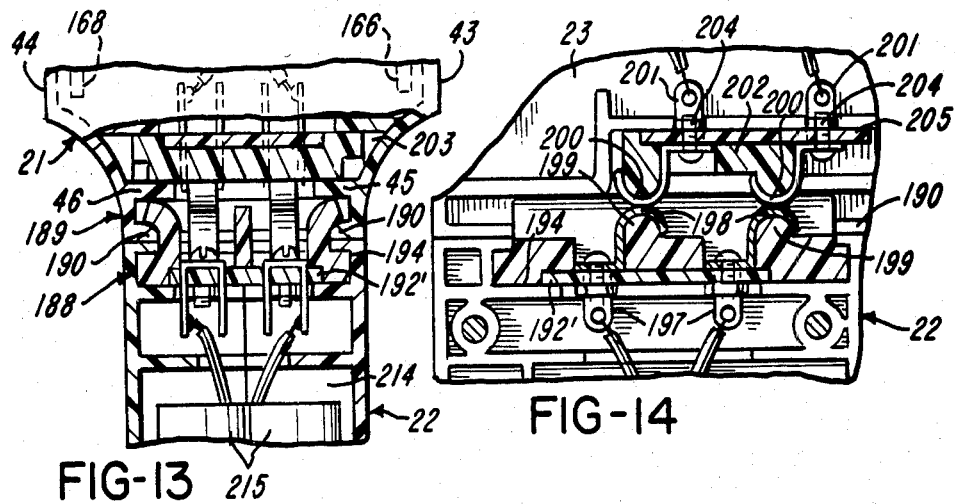
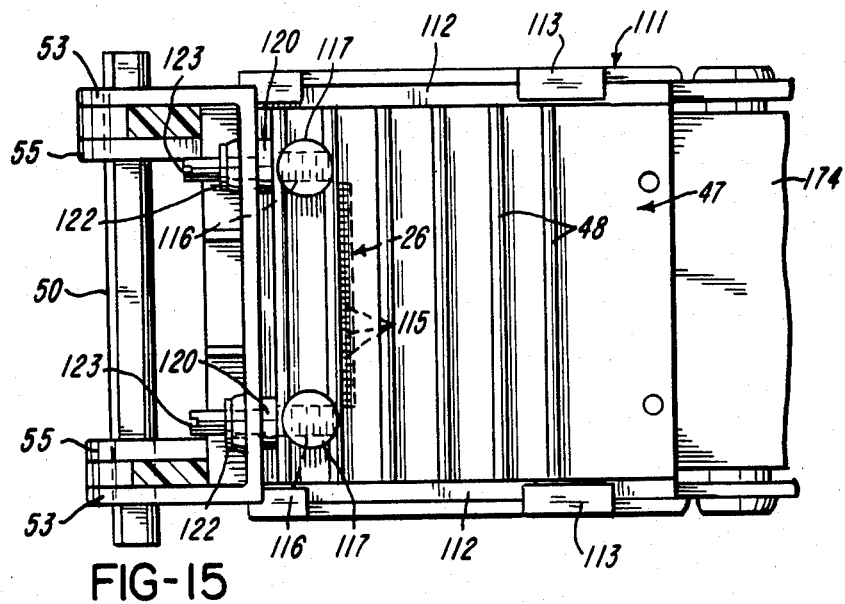

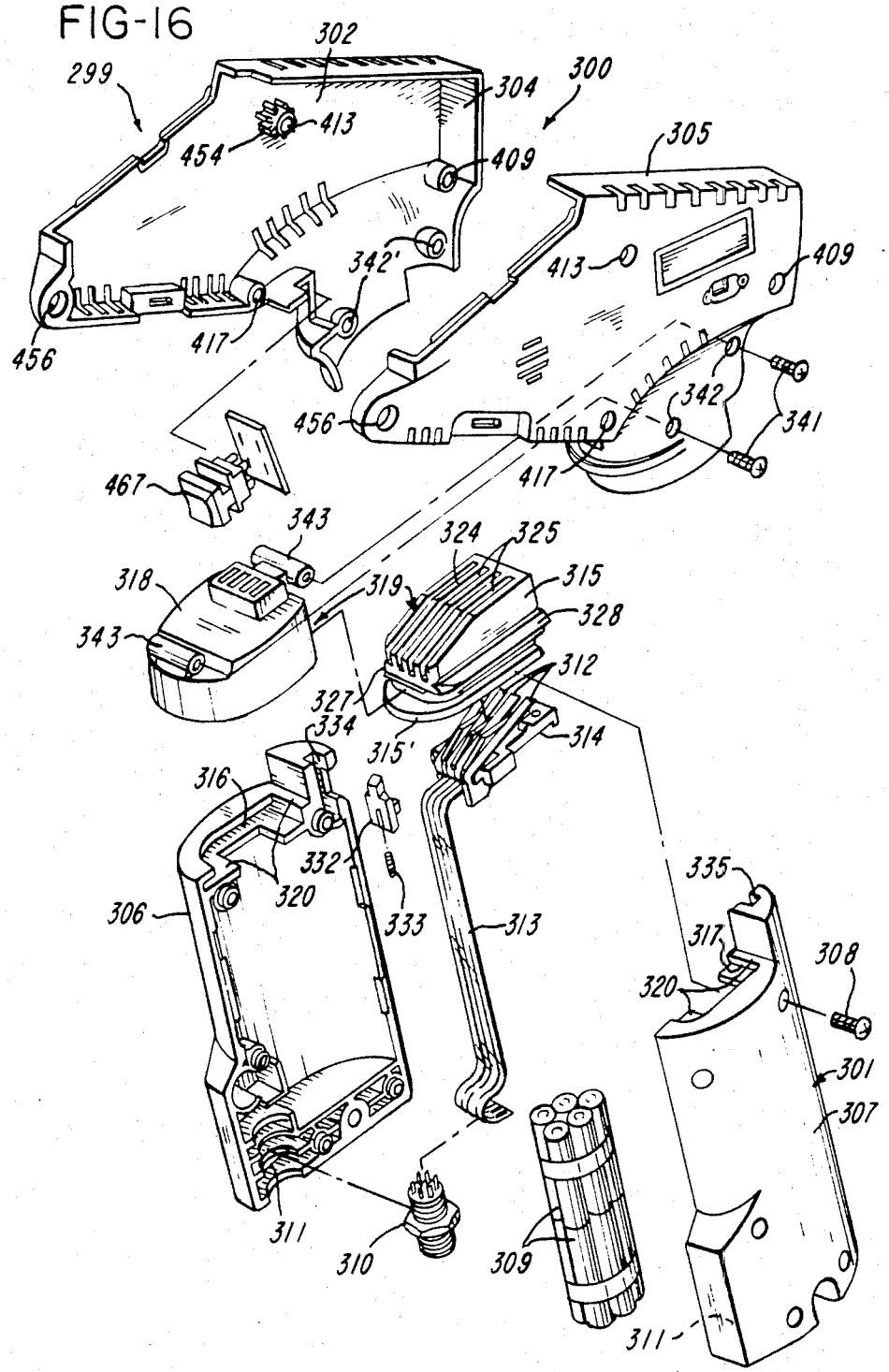

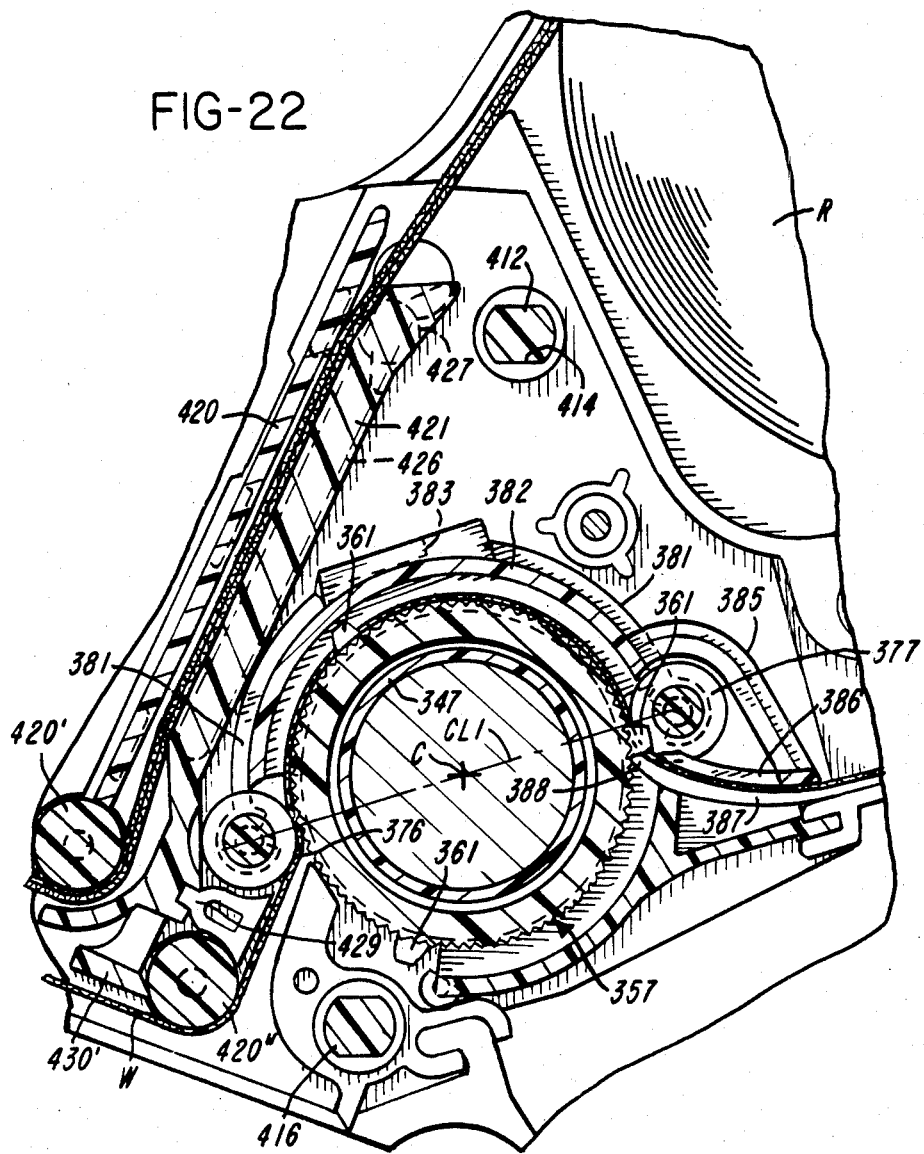

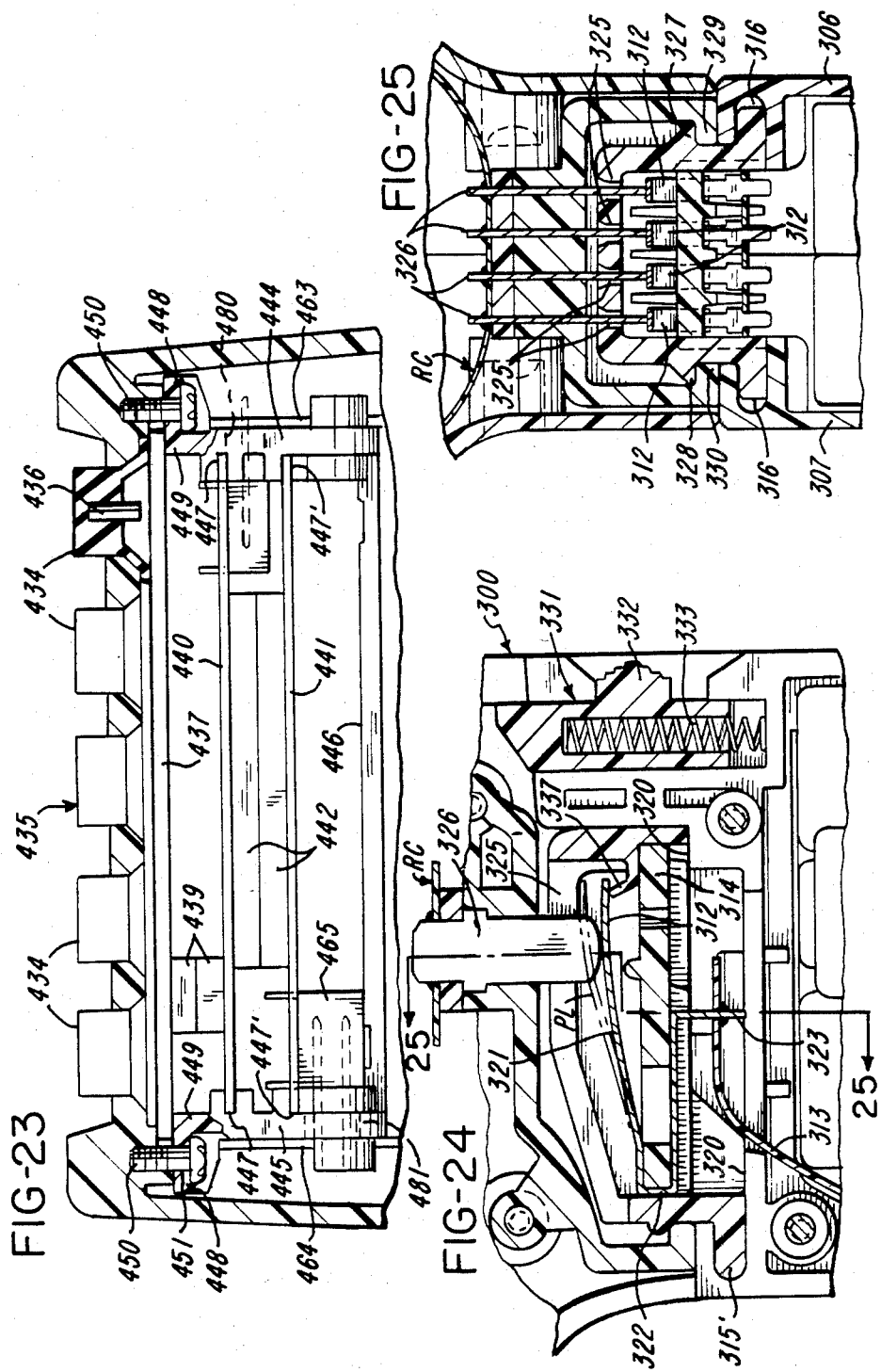

HAND-HELD LABELER

BACKGROUND OF THE INVENTION

1. Field of the Invention

This invention relates to the art of labelers and subcombinations thereof.

2. Brief Description of the Prior Art in the United States

The following U.S. patents are made of record: U.S. Pat. No. 2,663,444 to Kaplan granted Dec. 22, 1953; U.S. Pat. No. 3,611,929 to Kurt Schrotz granted Oct. 12, 1971; U.S. Pat. No. 4,092,918 to Paul H. Hamisch, Jr. granted June 6, 1978; U.S. Pat. No. 4,264,396 to Donald J. Stewart granted Apr. 28, 1981; and U.S. Pat. No. 4,407,692 to Daniel S. Torbeck granted Oct. 4, 1983.

SUMMARY OF THE INVENTION

It is a feature of the invention to provide an improved and compact construction for an electrically selectable hand-held labeler in which printed circuit boards are cushion or resiliently mounted to minimize damage in the event the labeler is impacted, for example when the labeler is dropped. It is a feature to provide a holder with means for holding printed circuit boards in spaced generally face-to-face relationship and at the same time to minimize damage due to impact. The holder is preferably composed of an elastomeric material that will deflect to facilitate assembly of the printed circuit boards and which will resiliently yield during impact. According to one embodiment of the invention some of the printed circuit boards are secured at spaced locations to parts of the labeler by elastomeric members.

BRIEF DESCRIPTION OF THE DRAWINGS

FIG. 6 is an exploded perspective view of the support for the platen roll, the adjusting mechanism and the applicator roll;

FIG. 7 is a partly sectional view showing an adjusting mechanism in detail;

FIG. 8 is an enlarged elevational view of a switch and switch mounting structure;

FIG. 10 is an exploded perspective view of the feed wheel;

FIG. 12 is an exploded perspective view of the labeler housing and the handle with its electrical energy source;

FIG. 13 is a fragmentary sectional view showing the breakaway connection between the handle and the housing;

FIG. 14 is another fragmentary sectional view along a plane perpendicular to the plane of FIG. 13;

FIG. 15 is a plan view showing the mechanism by which the print head can be aligned and held in alignment relative to the axis of the platen roll;

FIG. 16 is an exploded perspective view of a portion of an embodiment of the invention;

FIG. 22 is a sectional view showing feed and guide structure for the carrier web;

FIG. 23 is an elevational view partly in section showing the manner in which the printed circuit boards are oriented relative to each other;

FIG. 24 is an elevational view showing the manner in which the handle is coupled to the housing; and FIG. 25 is a sectional view taken along line 25—25 of FIG. 24.

DETAILED DESCRIPTION OF THE PREFERRED EMBODIMENT

Figure 1:
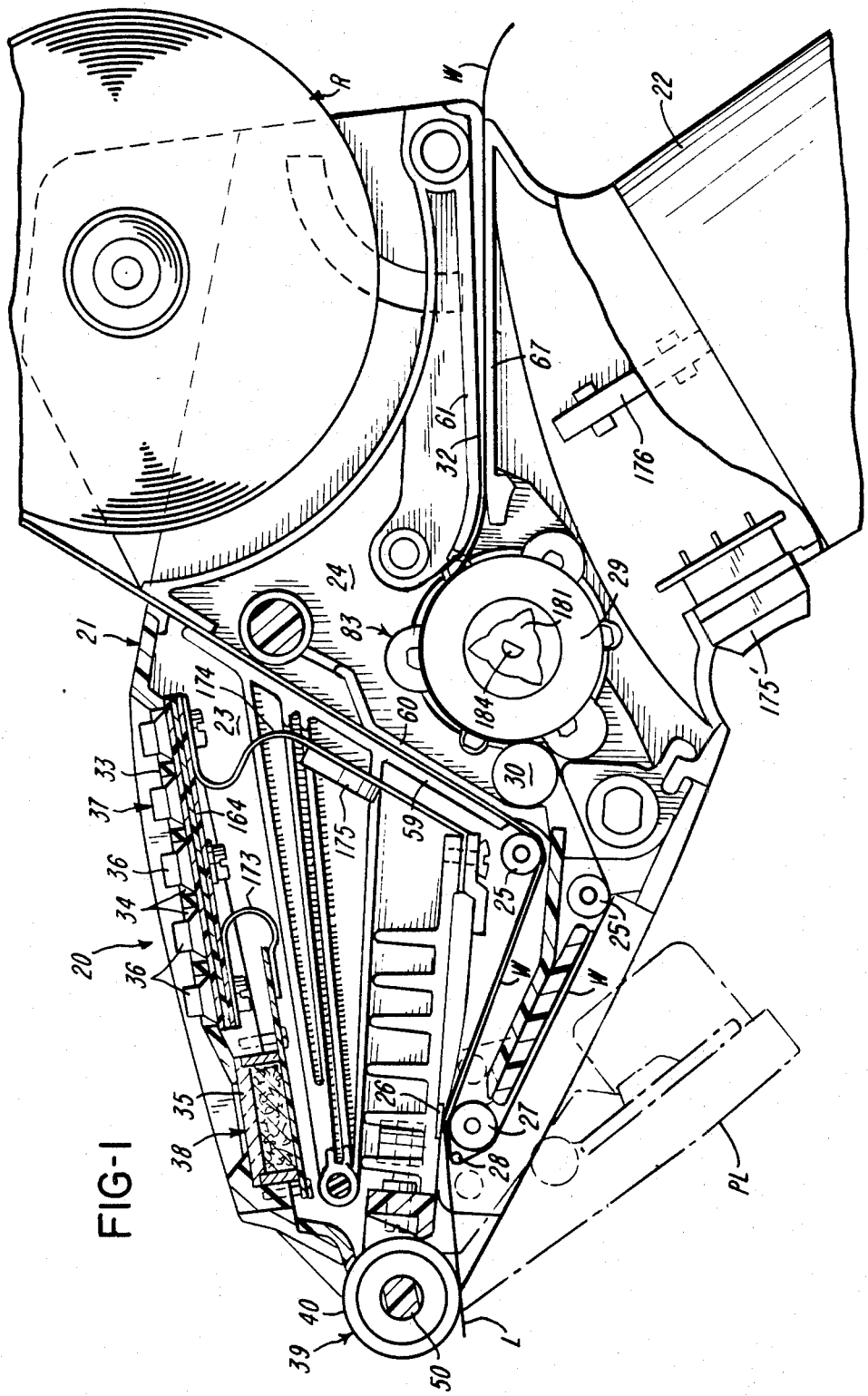
FIG. 1 is a partly sectional elevational view of a hand-held labeler in accordance with the invention.
Figure 3:
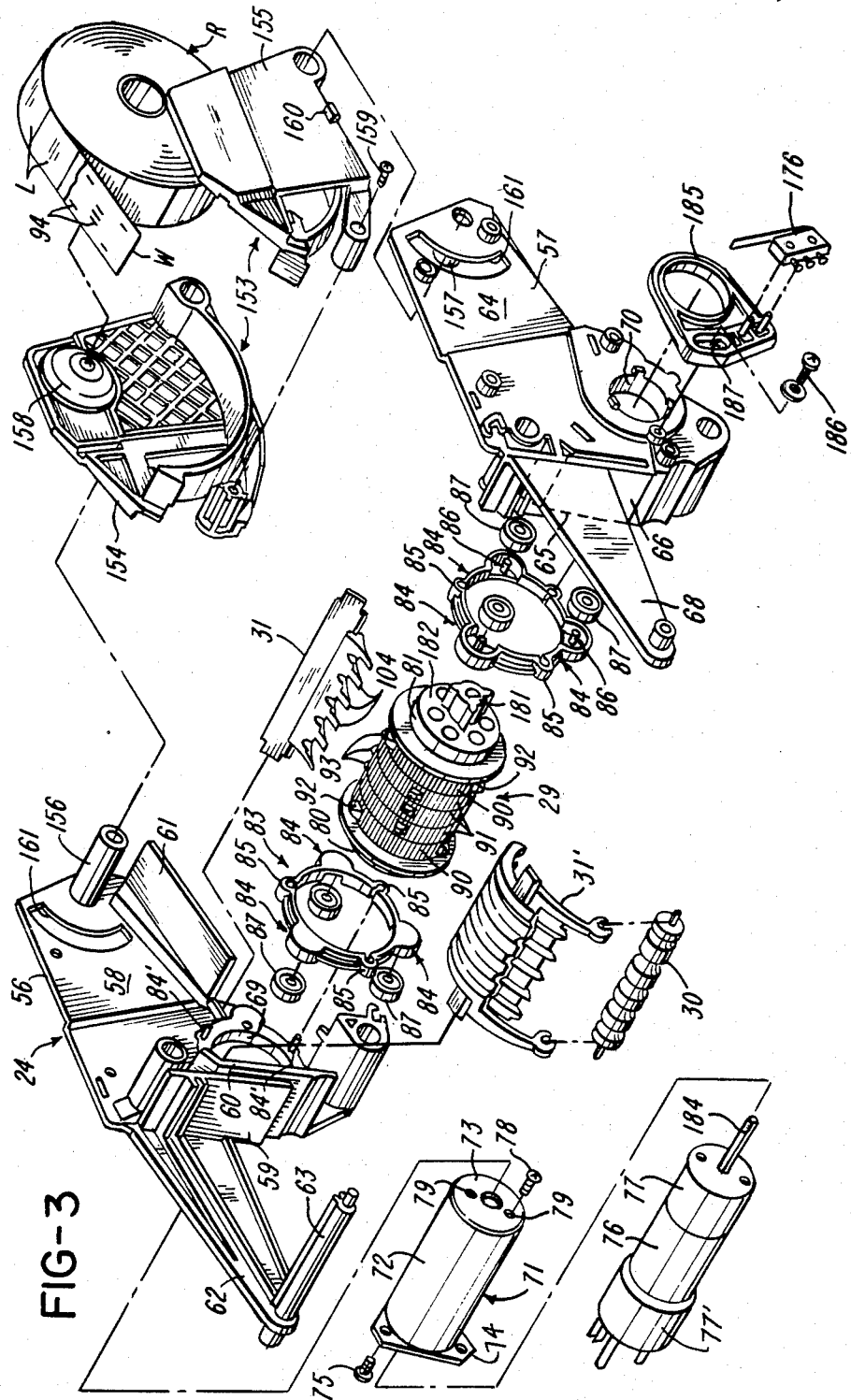
FIG. 3 is an exploded perspective view of portions of the labeler.

With reference initially to FIG. 1, there is shown a hand-held labeler generally indicated at 20 having a housing 21 and a handle 22. A label supply roll R includes a carrier web W which releasably carries a series of pressure sensitive labels L. The housing 21 has interior space 23 which receives a subframe 24. The subframe 24 rotatably supports the label roll R and provides a path for the carrier web W. The web W passes from the label roll R, partly about roller 25, to between a print head 26 and a platen shown to be in the form of a roll 27, partly around a delaminator 28 shown to be in the form of a peel roller, then again partly around the platen roll 27, partly around a roll 25', between a feed wheel 29 and a back-up roll 30, past a stripper 31 (FIG. 3), through exit channel 32 from which the web W exits from the labeler 20. The roll 30 is mounted on a guide 31' (FIG. 3).

The housing 21 includes a housing section 33 having a plurality of openings 34 and 35. Keys 36 of a keyboard 37 project through openings 34 and a display 38 is visible through the opening 35.

An applicator 39 having a series of rolls 40 is positioned in overlying relationship with respect to the leading label L which has been almost fully delaminated at the delaminator 28.

Figure 2:
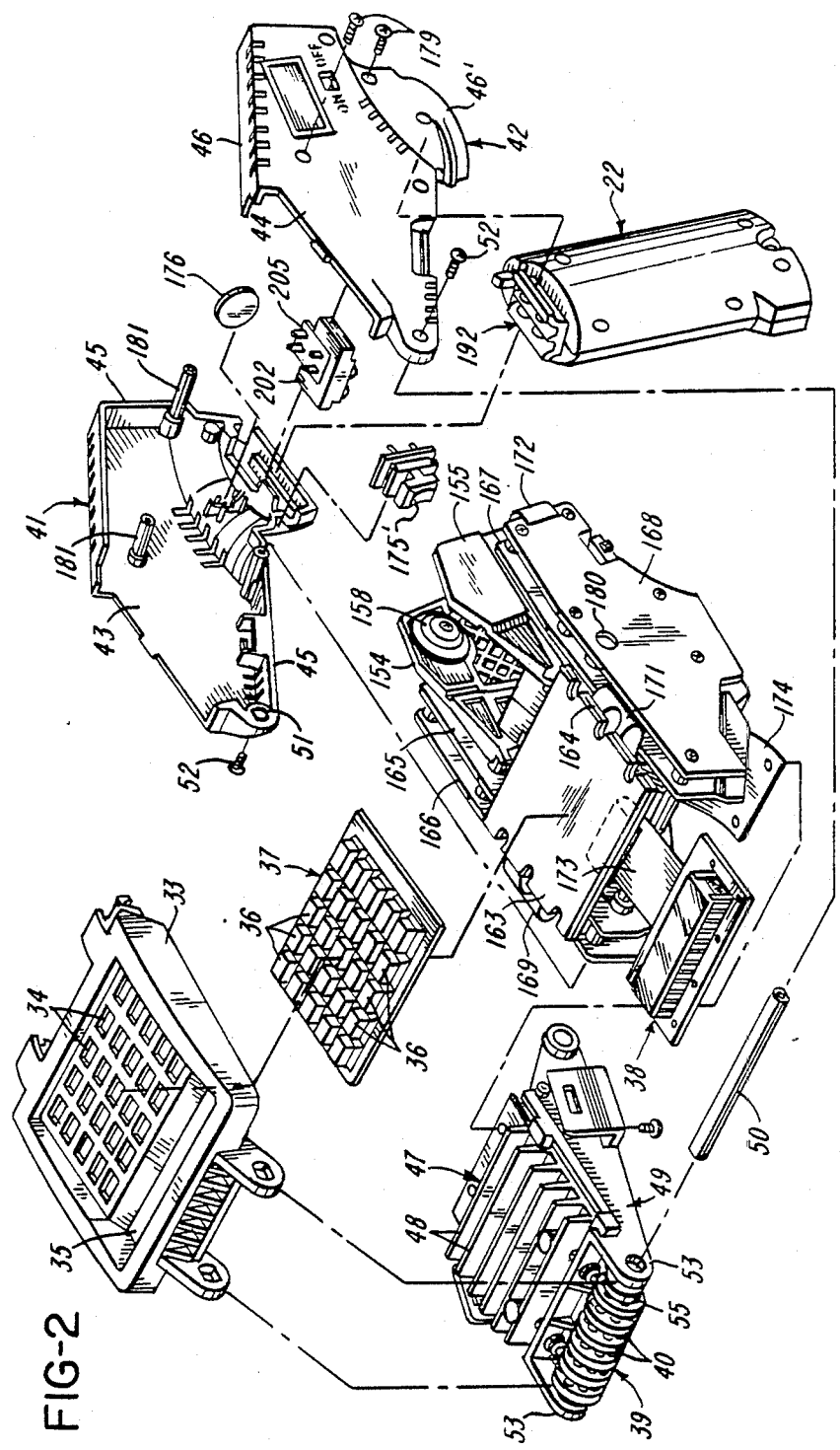
FIG. 2 is a partly exploded perspective view showing certain components of the labeler.

With reference to FIG. 2, it is seen that the housing 21 also includes housing sections 41 and 42. The housing sections 41 and 42 are essentially mirror image in construction. The housing sections 41 and 42 include respective side or wall portions 43 and 44 and flange portions 45 and 46.

The print head 26 is clamped or otherwise held to the bottom of a support 47 composed of metal to provide a heat sink. The support 47 has a plurality of fins 48. The support 47 is positioned in overlying relationship with respect to a support 49. A rod or shaft 50 of non-circular section is received at its end portions in matching holes 51, and screws 52 pass through housing sections 43 and 44 into end portions of the rod 50. The rolls 40 are rotatably mounted on the rod 50 and the support 49 has spaced arms 53 through which the rod 50 extends. Another support 54 best shown in FIGS. 5 and 6 has arms 55 through which the rod 50 also extends. The support 54 underlies the support 49.

Figure 11:
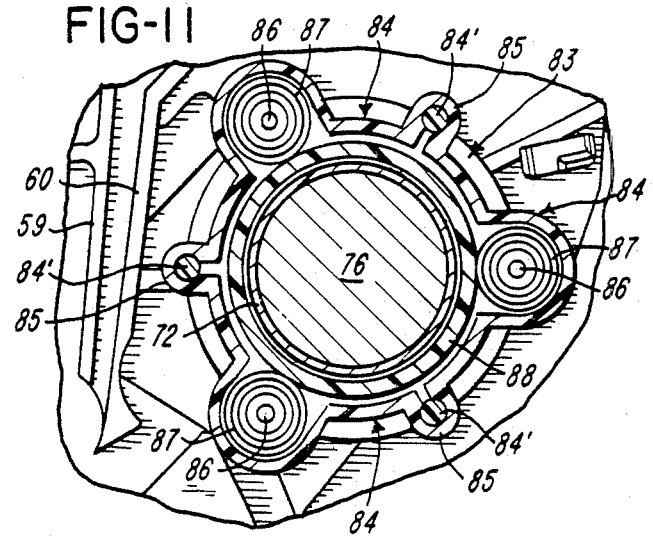
FIG. 11 is a sectional view showing the mounting structure for the feed wheel.

With reference to FIG. 3, there is shown the subframe 24 as having singularly configured mirror image subframe sections 56 and 57. The subframe section 56 has a side portion 58, guide members 59, 60 and 61, and arm 62 and a stud 63. The subframe section 57 has a side portion 64, guide members 65, 66 and 67, and an arm 68. The subframe sections 56 and 57 have aligned holes 69 and 70. A mounting member generally indicated at 71, and composed of metal for heat dissipating purposes, has a tubular portion 72, an end wall 73 and a flange 74. The mounting member 71 is inserted through the opening 69 and the flange 74 is held against the outside of the subframe section 56 by means of screws 75. The outside of the tubular portion 72 makes a close fit in the hole 69. An electric motor 76 is disposed entirely inside the tubular portion 72 and as is preferred the speed reducer 77 is disposed entirely inside the tubular portion 72. A shaft encoder 77' projects slightly beyond the motor 76. Screws 78 pass through holes 79 and are threaded into end portion of the speed reducer 77. As shown in FIG. 11 there is clearance between the mounting member 71 and the inside of the feed wheel 29. The feed wheel 29 has a pair of annular outer surfaces 80 and 81. A plurality of teeth 92 and 93 are arranged in a desired pattern on the outer periphery of the feed wheel 29 between the outer surfaces 80 and 81. A pair of identical holders 83 are mounted on pins 84' on the subframe sections 56 and 57 adjacent respective openings 69 and 70. Each holder 83 is shown to have three holder sections 84 joined by C-shaped flexible connectors 85. Each holder section 84 has a pin 86 for mounting rolling contact members, specifically a ball bearing 87. As shown in FIG. 11, outer races of the ball bearings 87 contact the outer surface 80 at three points of contact. Each holder 83 is configured so that the circle defined by the ball bearings 87 at the points of contact is smaller than the diameter of the respective outer surface 80 or 81 in the as-molded condition of the respective holder 83. Each holder 83 can be expanded slightly. The connections 85 aid in this expansion. In assembling the holder 83 and its ball bearings 87 onto the feed wheel 29, the holder 83 is expanded slightly and moved into position around the outer surface 80 or 81. The holder 83 will eliminate play because there is no clearance between outer races of the ball bearings 87 and the outer surfaces 80 or 81. As shown, each set of ball bearings 87 supports the feed wheel 29 at three places and specifically at three angularly spaced intervals of 120 degrees. The feed wheel 29 is rotatably mounted with very little friction. The reverse movement of the feed wheel 29 can be prevented either by the motor 76 itself or by any suitable known type of anti-backup device.

With reference to FIG. 10, the feed wheel 29 is shown to have a hub or base 88 with axially extending dovetail grooves or recesses 89. The grooves 89 are disposed at different angular locations to aid in orientation of rings 90 and 91. The rings 90 and 91 have respective outwardly projecting feed teeth 92 and 93 which can engage feed cuts 94 (FIG. 3) in the carrier web W. The rings 90 have inwardly extending projections 95, 96 and 97 which match the spacing of grooves 89. The rings 91 have inwardly extending projections 98, 99 and 100 which also match the spacing of grooves 89. As shown, the teeth 92 of the rings 90 are axially aligned, and the teeth 93 of the rings 91 are axially aligned. The teeth 92 and 93 make the desired feed tooth pattern and match the feed slot pattern in the carrier web W illustrated in FIG. 3. A feed wheel 29 having any selected feed tooth pattern can be constructed by simply providing rings having the desired arrangement of feed teeth. Also, a feed wheel 29 can be constructed of any desired effective diameter for a different label length, for example by changing the wall thickness of the ring 90 or 91. Each ring 90 and 91 is a coupling device which couples one or more teeth 92 and 93 to the hub 88. Although the teeth 92 can be coupled to the base 88 by other than such a unitary ring 90 or 91, the use of rings is preferred. It is preferred that the hub and the rings 90 and 91 each be of one-piece molded plastics construction. The rings 90 and 91 fit snugly onto the hub 88 to avoid any play and thus the feed wheel 29 is a composite which can be precision-built at low cost and yet have the ability to be constructed quickly in the selected pattern. If desired, like rings 90 can be color-coded in one color and like rings 91 can be color-coded of a different color to facilitate parts storage and subsequent assembly. As shown in FIG. 10, each ring 90 and 91 has a pair of narrow annular reduced diameter portions 101 between which there is an annular portion 102 having a closely spaced axially extending serrations 103. The serrations 103 reduce the area of contact between the outer surface of the feed wheel 29 and the carrier web W. As shown, the teeth 92 and 93 are on the respective annular portions 102. When the rings 90 and 91 are stacked on the hub 88, the adjacent reduced diameter portions 101 of adjacent pairs of wheels 90 and 91 or 91 and 91 provide grooves which receive carrier web stripper fingers 104 of the stripper 31 (FIG. 3). When assembled, the rings 90 and 91 are in end-to-end abutting relation. The feed wheel 29 illustrated diagrammatically in FIG. 3 does not show the reduced diameter, groove-defining portions 101. Outboard of the series of rings 90 and 91 are discs 105 received around the surfaces 80 and 81. Each disc 105 has a hole 106. The discs 105 are edge guides for the carrier web W. Each disc 105 is disposed between a shoulder 107 on the hub 88 and the respective holder 83. The discs 105 can rotate relative to the hub 88 as the feed wheel 29 advances the carrier web W. In assembling the feed wheel 29, the rings 90 and 91 are slid axially onto the hub 88, the discs 105 are positioned around surfaces 80 and 81 adjacent and against shoulders 107, and the holders 83 and their ball bearings 87 are positioned around the surfaces 80 and 81.

Figure 5:
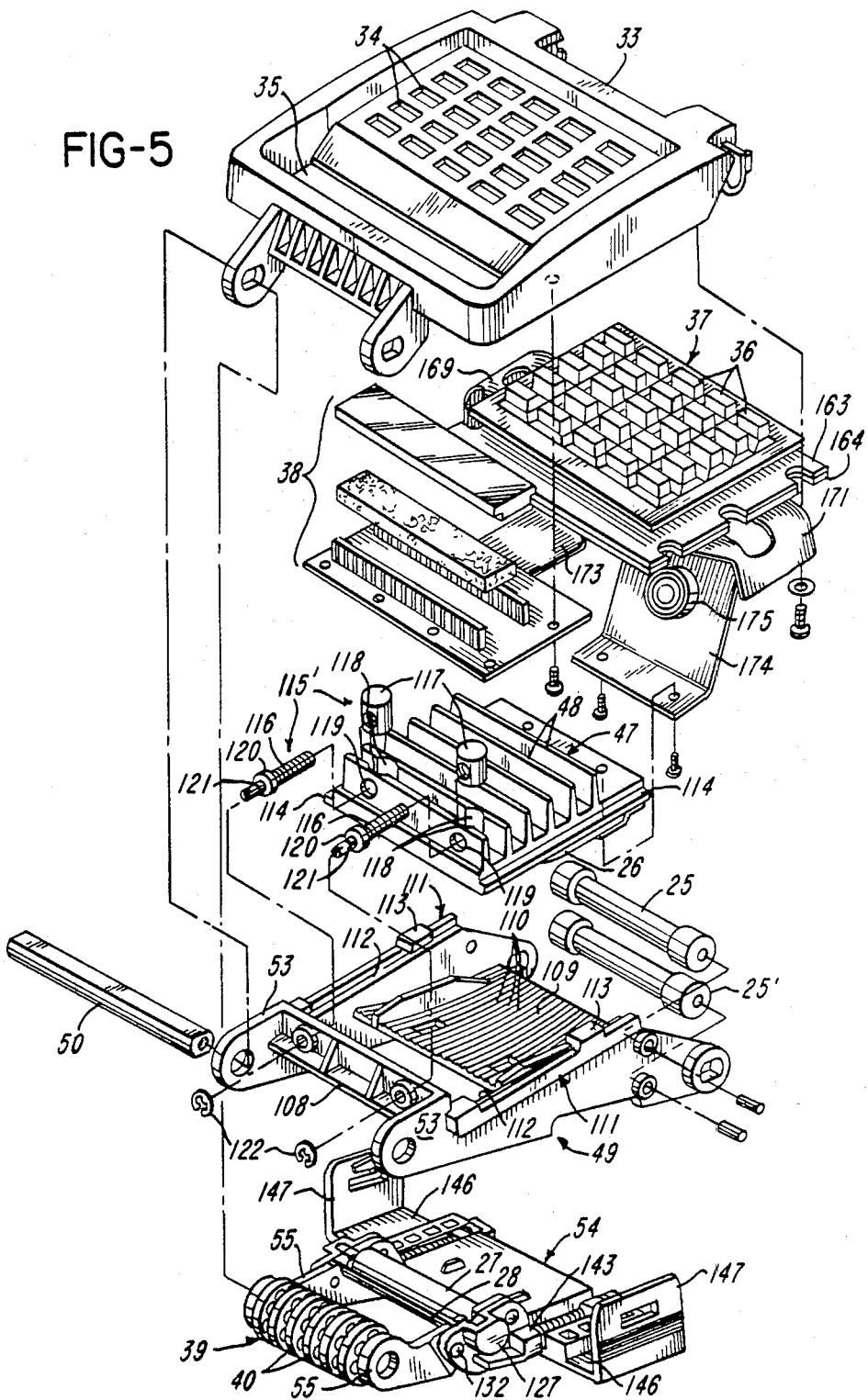
FIG. 5 is an exploded perspective view showing the arrangement of the keyboard, the display, the print head, various supports, the platen roll and the applicator.

With respect to FIGS. 5 and 15, the support 49 is shown to have a transverse member 108 joining members 53 and a transverse guide 109 having ridges 110. The members 53 have spaced tracks 111 defined by grooves 112 and flanges 113. The support 47 has a pair of flanges 114 received in the tracks 111. The flanges 113 keep the flanges 114 against the bottoms of grooves 112, although the tracks 111 are wide enough for the support 47 to skew so that the linearly arranged printing elements 115 of the print head 26 can be aligned with the axis of the small diameter platen roll 27. The smaller the diameter of the platen roll the more important such alignment becomes to quality printing. The skew of the support 47 and the print head 26 which is secured to its underside is illustrated to be adjustable by an adjusting mechanism generally indicated at 115'. The adjusting mechanism 115' is used when the labeler 20 is manufactured or when the print head 26 replaced. The adjusting mechanism 115' is illustrated as including a pair of adjusting screws 116 threadably received in annular members or bearings 117. The members 117 are insertable into and can rotate slightly relative to the support 47. Specifically, a pair of adjacent fins 48 have opposed concave seats 118 which receive the members 117. The endmost fin 48 has oversize openings 119 through which the screws 116 extend. The openings 119 are large enough to enable the members 117 to rotate enough to make the necessary scew adjustment of the support 47 in the tracks 111. The screws 116 have annular flanges 120 captive between the endmost fin 48 and the transverse member 108. Each screw 116 has a groove 121 which receives an E-ring 122. The end portion of each screw 116 has a screwdriver slot 123 (FIG. 15) to aid in rotation of the screws 116 individually.

With reference to FIGS. 5 and 6, the support 54 is shown to mount the platen roll 27. The platen roll 27 is preferably constructed of a roll 124 composed of elastomeric material mounted on a shaft 125. The shaft 125 extends beyond the ends of the roll 124 and is mounted in ball bearings 126. The ball bearings 126 are held captive in holders 127. Pivot screws 128 extend through holes 129 in holders 127 and allow the holders 127 to pivot slightly. The ball bearings 126 are nested in recesses 130. The holders 127 have elongated holes 131 through which screws 132 extend. Screws 128 and 132 are threaded into respective holes 133 and 134 in members or arms 55. The screws 132 are loose so that they do not clamp the holders 127 to the members 55 to enable the holders 127 to pivot. Each holder 127 is urged clockwise (FIGS. 6 and 7) by a helical compression spring 135 so that the roll 124 bears with the correct amount of pressure along its entire length against the underside of the carrier web W to press the overlying label L with the proper pressure against the printing elements 115 of the print head 26. A tube 136 is received within the spring 135 and an adjusting rod 137 is received within the tube 136. The rod 137 has a threaded portion 138. A nut 139 slidably received in a slot 140 is threadably received by the threaded portion 138. The rod 137 also has a flange 141 and an end portion with a screwdriver slot 142. The spring 135, the tube 136 and the rod 137 extend into a pocket portion 143 of the holder 127. The spring 135 acts on pocket portion 143 to urge the holder member 127 clockwise (FIGS. 6 and 7). The spring 135 also acts against the nut 139. The rod 137 can be rotated to adjust the force of the spring 135. By individually adjusting the rods 137, the force of the roll 124 against the printing elements 115 can be adjusted along the entire length of the series of printing elements 115.

The peel roller 28 is captive in slots 144 and the shaft 125 extends through slots 145 in the members 55. The members 55 are joined by a transverse member 146. The roll 124 is preferably of small diameter and the printing elements 115 are as close as possible to the peel roller 28. This maximizes the percentage of printable area on the label L. The roll 124 is preferably less than 0.4 inch in diameter and most preferably less than about 0.27 inch in diameter.

The support 54 is pivotable about the shaft 50 between the solid line position and the phantom line position indicated at PL in FIG. 1. The support 54 has transversely extending members 146 and upstanding members 147. By squeezing the members 147 between the thumb and index fingers of one hand, the members 147 deflect inwardly and become released from projections 149 on the inside of the housing sections 41 and 42. The members 147 have apertures 150 which receive the projections 149. When the support 54 moves down to a partially open position shown in FIG. 1 by the phantom lines PL, projections 151 on the inner side of the members 147 catch on projections 152 to prevent complete opening of the support 54, but the support 54 and the platen roll 27 are lowered enough to enable threading of the carrier web W during loading of the labeler 20. With the support 54 in the position shown by phantom lines PL, the members 147 can be spread, whereupon the support 54 can swing open to a fully open position to enable cleaning of the printing elements 115.

As shown in FIG. 3, the label supply roll R is mounted on a holder 153 having mirror image holder sections 154 and 155. The holder sections 154 and 155 are pivotally mounted for rotation as a unit on posts 156 and 157 on subframe sections 56 and 57. Thus, the holder 153 can be manually moved from the solid line closed position shown to an open position for ease of cleaning the carrier web pathway or removing a stray label. The roll R is rotatably mounted on opposed hub members 158, only one of which is shown. The holder sections 154 and 155 are shown held together by a screw 159. Lugs 160 project into arcuate slots 161 and limit the rotation of the holder 153.

Figure 4:
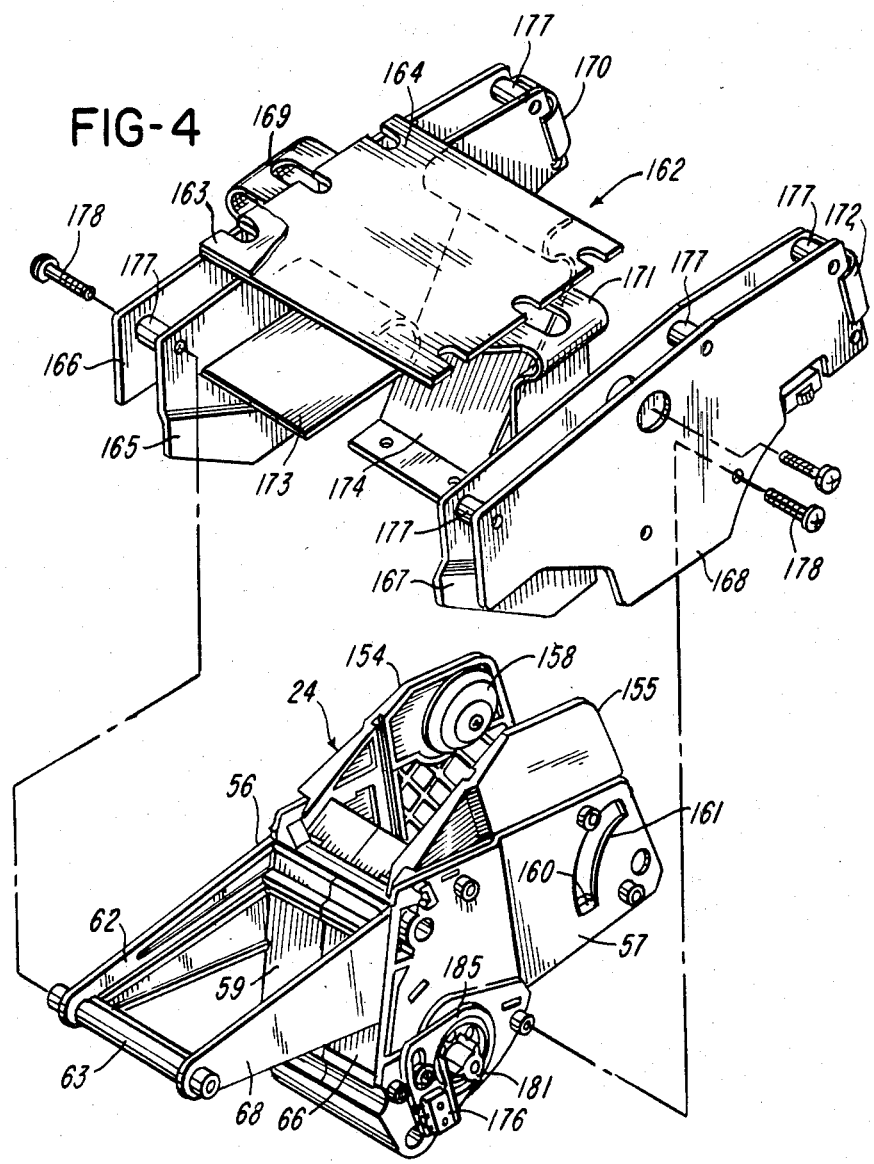
FIG. 4 is a partly exploded perspective view showing the manner in which circuit boards are arranged relative to the subframe.
Figure 9:
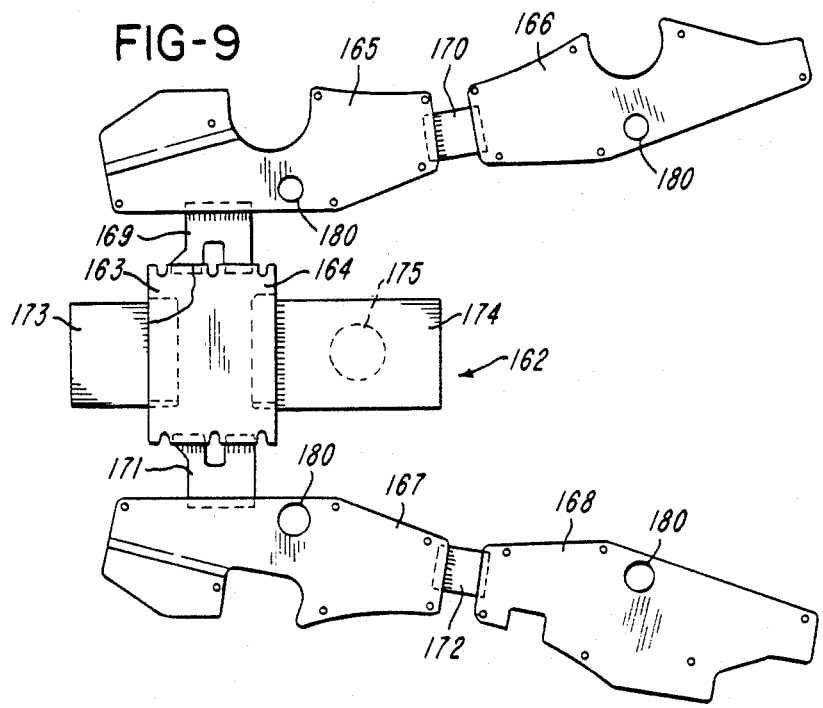
FIG. 9 is a plan view of an array of printed circuit boards and ribbon connectors before assembly into the housing.

With particular reference to FIG. 9, there is shown an array 162 of printed circuit boards 163 through 168. The printed circuit board 164 underlies but is electrically isolated from the printed circuit board 163 except for electrical connections therebetween. The printed circuit board 165 is electrically connected to the printed circuit board 164 by an electrical ribbon connector 169, the printed circuit board 165 is electrically connected to the printed circuit board 166 by an electrical ribbon connector 170, the printed circuit board 164 is also electrically connected to the printed circuit board 167 by an electrical ribbon connector 171, and the printed circuit board 167 is electrically connected to the printed circuit board 168 by an electrical ribbon connector 172. The display 38 (FIG. 1) is electrically connected to the printed circuit board 164 by an electrical ribbon connector 173, and the print head 26 is electrically connected to the printed circuit board 164 by an electrical ribbon connector 174. An audible device 175 is connected to the ribbon connector 174. Also suitably electrically connected to the array 162 are a small battery 176 for a low-battery sensing circuit (not shown), a manual switch 175' operable by the user's index finger to initiate a printing and dispensing cycle, and a cam operated switch 176. With reference to FIG. 4, the array 162 is shown in exploded disassembled orientation. The printed circuit boards 163 through 168 contain electronic components (not shown) electrically connected to operate the print head 26 in response to data inputted by the keyboard 37. The printed circuit boards 165, 166, 167 and 168 are all inclined with respect to the printed circuit boards 163 and 164, and more specifically are at right angles. The printed circuit boards 165 and 166 are closely spaced in side-by-side generally parallel relationship to each other, and the printed circuit boards 167 and 168 are closely spaced in side-by-side generally parallel relationship with respect to each other. The pairs of printed circuit boards 165 and 166, and 167 and 168, are spaced apart by spacers 177. Various screws 178 pass through the pairs of printed circuit boards 165 and 166, 167 and 168, and fasten them directly to the subframe 24. As shown in FIG. 13, the outer printed circuit boards 166 and 168 are spaced from the housing sections 41 and 42, so that any deflection of the housing 21 will not affect the printed circuit boards 163 through 168. Such deflection can result when the labeler 20 is dropped or otherwise impacted by excessive force. The housing sections 41 and 42 are secured to the subframe 24 by suitable fasteners 179. One such fastener 179 passes through the housing section 42 and into stud 181 which passes with substantial clearance through enlarged holes 180 in the printed circuit boards 165 through 168 so that the deflection of the housing 21 is not transmitted to the printed circuit board array 162. The array 162 is very compact as is important to a hand-held electrically selectable labeler specifically a hand-held labeler 20 with a thermal print head 26.

With reference to FIG. 8, the switch 176 is operated by a three lobed cam 181 molded integrally with end wall 182 of the hub 88. As shown, end wall 182 and the cam 181 have a non-circular hole 183 matched with non-circular portion of the speed reducer output shaft 184. The switch 176 is mounted to a support 185 which is rotatably held to subframe section 57 and held in adjusted position by a screw 186 extending through an elongated slot 187.

With reference to FIGS. 12, 13 and 14, there is shown the handle 22 which is detachably connected to the housing 21 by a detachable breakaway connection 188 which includes a dovetail slot 189 formed by opposed inwardly extending flanges 190 and outwardly extending flanges 191 of a connector 192. The connector 192 is composed of an elastomeric material having a selected hardness so that it will hold the handle 22 to the housing but will deflect to release the housing 21 when excessive force is applied as when the labeler 20 is dropped. When that happens the flanges 191 deflect inwardly out of the dovetail slot 189 and the housing 21 and the handle 22 separate. The connector 192 has a planar portion 193 captive in pockets 194 in the mirror image handle sections 195 and 196 of the handle 22. As shown in FIGS. 13 and 14, contacts 197 are J-shaped and are secured to a planar insulator 192'. The bottoms 198 of the J's are resiliently supported by convex portions 199 of the connector 192. The contacts 197 make connection with contacts 201 at the bottoms 200 of the J's of the J-shaped contacts 201. The bottoms 200 are resiliently supported by a pad 202 of resilient elastomeric material which is captive in a pocket 203. Fasteners 204 pass through a planar insulator 205. The handle 22 is attached to the housing 21 by sliding the handle 22 onto the housing 21 by means of the dovetail slot 189 and the connector 192. The handle 22 is releasably latched in position by a spring 206 acting on a latch 207. The spring 206 and the latch 207 are slidably received in a pocket 208. When the handle 22 is in its assembled position the latch 207 cooperates with shoulder 209. Also a shoulder 210 bears against a stop 211. A manually engageable projection 212 extends through opening 213 to enable manual release of the latch 207. The handle sections 195 and 196 provide a cavity for receiving rechargeable batteries 215 which are wired to the contacts 197. A connector 216 is coupled to the handle 22 by a washer 217 and a nut 218. The connector 216 is also electrically connected to the batteries 215 for recharging the batteries 215.

Figure 17:
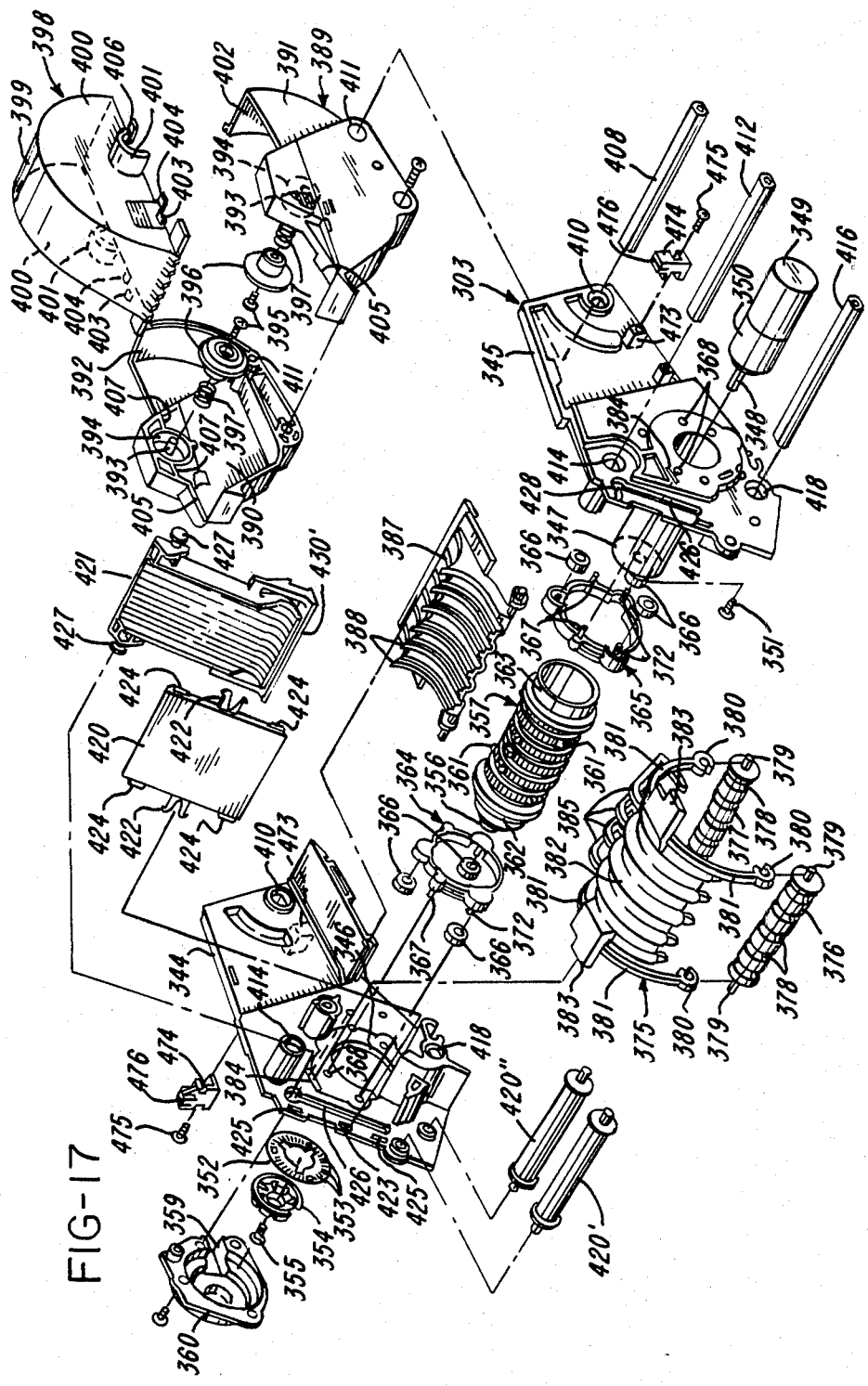
FIG. 17 is an exploded perspective view of an additional portion of the embodiment shown in part in FIG. 16.

With reference to FIG. 16, there is shown a housing or frame 300 and a handle 301. The housing 300 has interior space 302 which receives a subframe 303 (FIG. 17). The housing 300 includes a pair of substantially mirror-image housing sections 304 and 305. The handle 301 has a pair of handle sections 306 and 307 secured to each other by fasteners, one of which is shown at 308. The handle 301 receives a plurality of rechargeable nickel-cadmium batteries 309. An electrical connector 310 received in opposed pockets 311 in the handle sections 306 and 307 and electrical contacts 312 (FIGS. 16, 24 and 25) are connected by a flexible ribbon connector 313. The connector 310 is urged for recharging the batteries 309. The batteries are also suitably connected to the ribbon connector 313. The contacts 312 are mounted on a holder 314. A coupling member 315 has a bottom flange 315' received in mirror-image pockets 316 and 317 in handle sections 306 and 307. The coupling member 315 and a coupling member 318 cooperate to provide a coupling generally indicated at 319. The holder 314 is held in place by ledges 320 on sections 306 and 307. The contacts 312 are mounted on the holder 314 as best seen in FIGS. 24 and 25. The contacts 312 are identical, and each contact has a flexible resilient spring finger 321, a U-shaped portion 322 joined to the spring finger 321, and a depending portion 323 joined to the U-shaped portion 322. Each depending portion 323 is electrically connected to the ribbon connector 313. Upper portion 324 of the coupling member 315 has a plurality of slots 325 vertically aligned with the contacts 312. The slots are wide enough to receive rigid contacts 326. The coupling member 315 has spaced outwardly extending projections 327 and 328 received above flanges 329 and 330 of the coupling member 318. The handle 301 is attached or coupled to the housing 300 by sliding the handle 301 onto the housing from the rear using the cooperating pair of projections 327 and 328 and flanges 329 and 330. The handle 301 is held in the attached position shown in FIG. 24 by a latch generally indicated at 331 which includes a finger-engageable latch member 332 and a spring 333 received in mirror-image pockets 334 and 335 in handle sections 306 and 307. The latch member 332 latches against the housing 300. As the handle 301 is moved from the detached or uncoupled position into the attached position, the contacts 326 enter the slots 325 and deflect the spring fingers 321 from the phantom line position indicated at PL to the solid line position. When the handle is still slightly out of the attached position (to the right of the position shown in FIG. 24 relative to the housing 300), the contacts 312 abut a stop 337. The spring fingers 321 of the contacts 312 are now prevented from moving in either direction as when the labeler 299 is impacted, for example when the labeler 299 is dropped. The contacts 326 hold the contacts 312 against the stop 337 and the stop 337 prevents the contacts 312 from moving away from and out of electrical contact with the contacts 326. In this way the circuitry 338 (FIG. 19) cannot lose memory by interruption of the electrical connection between the batteries 309 and the memory 340 when the labeler 299 is impacted. The upper portion 324 enables the contacts 326 to make electrical contact with the contacts 312, but serves as a protective shield to prevent the contacts 312 from becoming damaged as for example when the handle 301 is detached for recharging. The coupling member 315 is economical to manufacture because it is of one-piece molded elastomeric construction. The projections 327 and 328 and the cooperating flanges 329 and 330 are configured so that the handle 301 will separate or break away from the housing 300 when the labeler 299 is impacted. To facilitate this, the flanges 327 and 328 deflect resiliently and enable the projections 327 and 328 to pass around the flanges 329 and 330 even though the latch 331 is latched.

Instead of coupling the coupling member 315 directly to two mirror-image housing sections (as shown in FIGS. 2, 12, 13 and 14), the coupling member 315 is coupled to the coupling member 318 which in turn is securely mounted between the housing sections 304 and 305. In this way the coupling action does not occur at a place where the housing 300 is split. As shown, the coupling member 318 is secured as by screws 341 which pass through holes 342 into annular members 343 which are an integral part of the one-piece molded plastics coupling member 318. Additional screws (not shown) pass through holes 342' into members 343. Thus, the housing sections 304 and 305 are securely connected to the coupling member 318.

With reference to FIG. 17, there is shown the subframe 303 which includes substantially mirror-image subframe sections 344 and 345. The section 344 has a hole 346 axially aligned with a tubular member 347 which is molded integrally with the section 345. The tubular member 347 has an end wall (hidden in FIG. 17) having a hole through which output shaft 348 extends. An electric motor 349 is coupled to a speed reducer 350. The motor 349 and speed reducer 350 are secured to the end wall by means of screws 351, only one of which is shown. The output shaft 348 of the speed reducer 350 passes through the hole 346. A disc 352 having a series of peripherally spaced graduations 353 is keyed to end position 356 of a feed wheel 357. A resilient washer 354 and a screw 355 which passes through the washer 354 is threaded into the end portion 356 to hold the disc 354 onto the feed wheel. End portion 356 of the feed wheel 357 is keyed to the shaft 348. A sensor 358 (FIG. 19) is received in a pocket 359 in holder a 360. The disc 352 and the sensor 358 cooperate to signal the circuitry 338 as to the position of the feed wheel 357. The feed wheel 357 has teeth 361 in a predetermined pattern so that the carrier web W (FIG. 1) and the labels L which it carries are properly registered therewith. The sensor 358 signals the circuitry 338 to in turn register of the labels L with the printing position and the label applying position.

Figure 20:
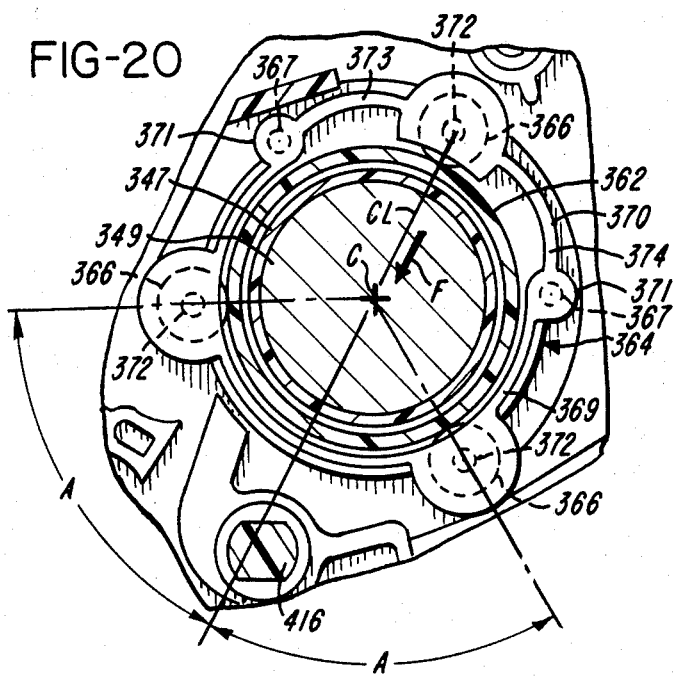
FIG. 20 is an elevational view partly in section showing the manner in which the feed wheel is mounted.

The feed wheel 357 has a pair of spaced annular portions 362 and 363. A pair of spaced holders 364 and 365 mount sets of rolling-contact members, preferably ball bearings 366. The holders 364 and 365 have locating and holding pins 367 received in spaced holes 368 in the subframe sections 344 and 345. The ball bearings 366 bear against the outer peripheries of respective annular portions 362 and 363. As best shown in FIG. 20, the holder 364 has a relatively rigid section 369 connected to a relatively flexible resilient section 370 at pin-mounting portions 371. The pin-mounting portions 371 have the pins 367 molded integrally therewith. In fact, each holder 364 and 365 is identical and is of one-piece molded plastics construction. Pins 372 integral with each holder 364 and 365 mount the ball bearings 366. Each holder 364 and 365 is molded so that in the as-molded condition the ball bearing 366 mounted by the section 370 is closer to the center C of the circle than either of the ball bearings 366 mounted by the section 369. When the feed wheel 357 is positioned relative to ball bearings 366 so that annular portions 362 and 363 are in supported contact with the ball bearings 366, then flexible resilient arms 373 and 374 are deflected outwardly. This arrangement insures that all play is eliminated between the ball bearings 366 and the outer peripheral surface of the annular portions 362 and 363. The ball bearings 366 mounted by the section 369 are disposed at equal angles A with respect to a centerline CL. The centerline CL is along the line of force exerted by the carrier web W on the feed wheel 357 as the feed wheel 357 advances the web W. The direction of this force is in the direction indicated by arrow F. Each section 369 mounts the two ball bearings 366 firmly so as to provide a reference. The ball bearing 366 mounted by each section 370 is resiliently mounted.

With reference to FIG. 17, there is shown (on a slightly enlarged scale) a holder 375 for mounting a pair of back-up rolls 376 and 377. The rolls 376 and 377 are identical and have annular grooves 378 in line with the feed teeth 361 so that the teeth 361 miss the rolls 376 and 377 as the feed wheel 357 rotates. Each roll 376 and 377 has an outboard shaft portion 379 snap-fitted into C-shaped portions 380 at the end portion of each flexible resilient spring finger 381. In the as-molded condition of the holder 375, the C-shaped portions 380 would hold the rolls 376 and 377 closer together than the diameter of the feed wheel 357. Upon assembly, the arms or spring fingers 381 are flexed outwardly by the feed wheel 357 and press the rolls 376 and 377 against the feed wheel 357. The centers of the rolls 376 and 377 lie along a centerline CL1 (FIG. 22) which passes through the center C. In this way, the rolls 376 and 377 apply balanced forces to the feed 357, but do not apply any force to the feed wheel 357 which would have to be counteracted by the bearings 366. As shown, the ball bearings 366 contact the outer surface of the feed wheel 357 120° apart. The holder 375 also has an arcuate guide portion 382 to which the spring fingers 381 are joined. Locating and holding projections 383 (FIG. 17) extend outwardly from the guide portion 382 and are received in slots 384 in the subframe sections 344 and 345. A plurality of laterally spaced guides 385 are joined to the guide portion 382. The guides 385 have upper guide members 386 (FIG. 22) spaced slightly from guide member 387 to guide the carrier web away from the feed wheel 357. The web W passes first between the roll 376 and the feed wheel 357, then about the feed wheel for 180°, then between the roller 377 and the feed wheel 357, and then between guide members 386 and 387 and out of the labeler 299. The guide member 387 is formed integrally with a plurality of stripper elements 388. The subframe sections 344 and 345 also rotatably mount guide rolls 420' and 420".

A label roll R (FIG. 22) is mounted in a label roll holder generally indicated at 389 in FIG. 17. The holder 389 has substantially mirror-image sections 390 and 391. Each section 390 and 391 has a post 393 disposed concentrically within an annular bearing surface 394. Screws 395 passing through respective aligned mounting members 396 are threadably received in end portions of the posts 393. The mounting members 396 are freely rotatable on posts 393. Springs 397 which encircle the respective posts 393 urge the mounting members inwardly toward each other to hold the label roll R securely to the mounting members 396, but the springs 397 can yield to enable a new label roll to be inserted between the mounting members 396. A protective movable closure or cover 398 has an arcuate portion 399 and spaced walls 400 joined to the arcuate portion 399. The closure 398 keeps out dust and the like and to prevent the thermally coated paper of which the labels L are constructed from having unnecessary contact with the environment. The closure 398 and the holders 389 define a space 392 for enclosing the label roll R. The cover 398 has a pair of arcuate mounting members 401 received within the bearing surfaces 394. Thus, the cover 398 is rotatable from its position in which the cover 398 and the holder 389 enclose the roll R to a position in which the cover 398 is in a rotated, retracted position within the space 392 so that the arcuate surface 399 is in face-to-face relation with respect to the inside surface 402 of the holder 389. In the retracted position the label roll R can be loaded onto the holder members 396, after which the cover 398 can be rotated to its closed position. The cover 398 is considered to be a rotary telescoping member with respect to the holder 389. The cover 398 is held in its closed position by a double detent provided by outwardly extending projections 403 and 404 which releasably snap under flanges the holder 389. Projections 406 cooperate with the projections 407 (only visible on section 390) on each section 390 and 391 to limit the rotary movement of the cover 398. The arcuate extent of the cover 398 is less than about 210° and preferably less than 190° and most preferably about 180°, but the combined extents of the holder 389 and the cover 398 should be 360° to close off the space.

Figure 18:
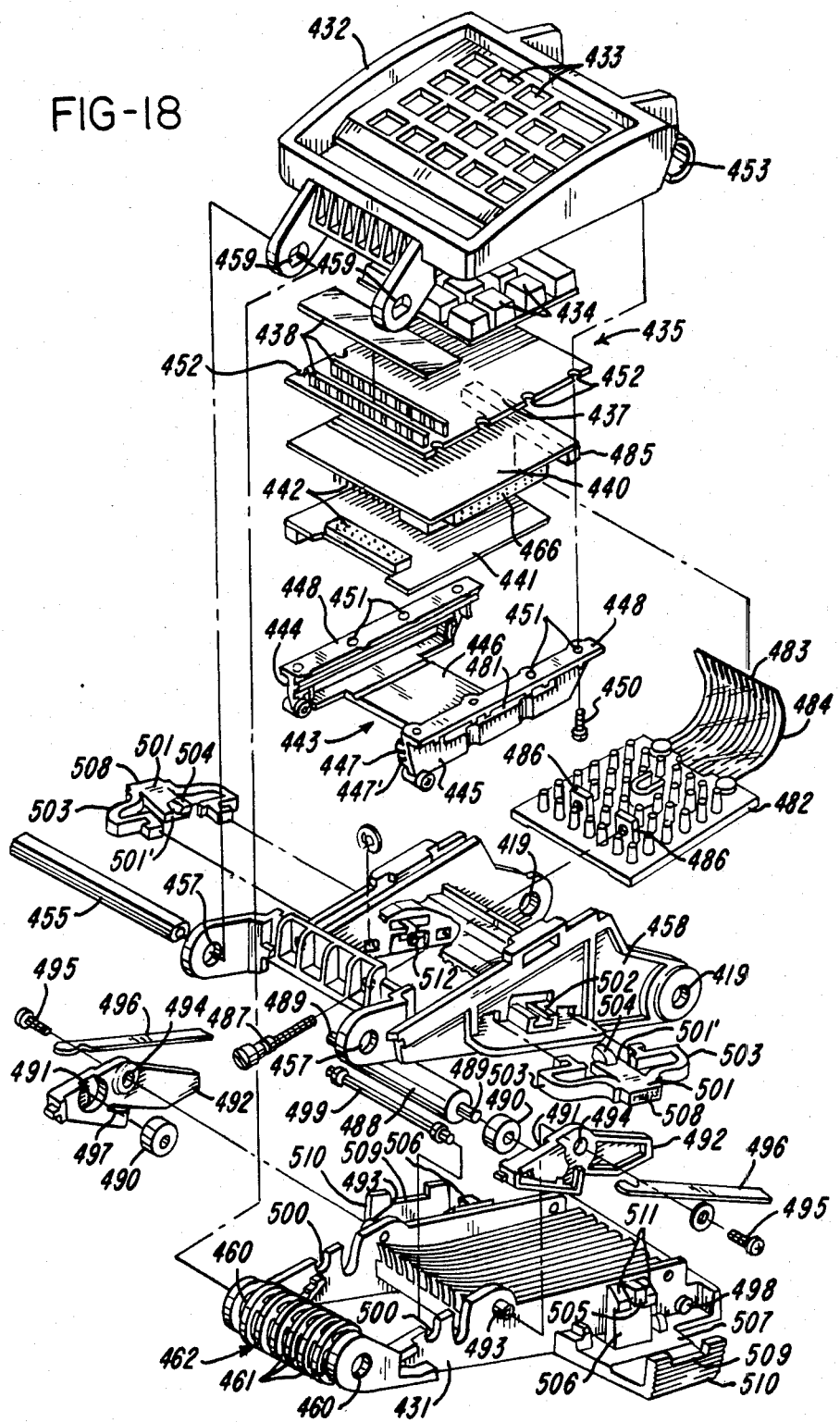
FIG. 18 is an exploded perspective view of yet an additional portion of the embodiment shown in part in FIGS. 16 and 17.
Figure 21:
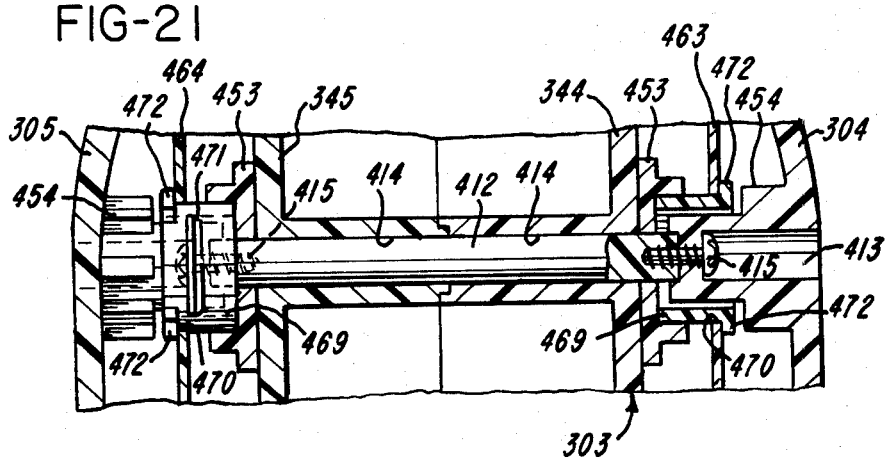
FIG. 21 is a sectional view showing the manner in which housing sections are connected and the manner in which the printed circuit boards are mounted.

A tie rod 408 is aligned with holes 409 (FIG. 16) in the housing sections 304 and 305. Screws (not shown) pass through the holes 409 and thread into the end portions of the tie rod 408. The tie rod 408 also passes through holes 410 in the sections 344 and 345 and holes 411 in the holder sections 390 and 391. A tie rod 412 is aligned with holes 413 (FIGS. 16 and 21) and holes 414. Screws 415 hold the housing sections 304 and 305 together as best shown in FIG. 21. A tie rod 416 is aligned with holes 417 (FIG. 16), holes 418 (FIG. 17) and holes 419 (FIG. 18). Screws (not shown) pass through the housing section holes 417 and thread into the end portions of the tie rod 416.

A pair of guides 420 and 421 (FIGS. 17 and 22) guide the web W from the roll R. The guide 420 snaps into subframe sections 344 and 345 using snap fasteners 422 formed integrally with the guide 420. The fasteners 422 are received in holes 423 (only one of which is shown). Projections 424 are received in pockets 425. The guide 421 has outwardly extending projections which can be inserted into slots 426 during assembly by inserting heads 427 through enlarged holes 428 and then sliding the guide 421 downwardly. Lower end portion of the guide 421 is held captive between fixed projection 429 and end portion 430 (FIG. 18) of bottom member 431.

With reference to FIG. 18, a housing section 432 has a plurality of openings 433 for receiving key buttons 434 of a keyboard 435. Each key button 434 includes a conductive element 436 (FIG. 23) which makes contact between a spaced pair of printed conductors (not shown) on a printed circuit board 437. Each conductive element 436 is normally biased out of contact with the printed circuit board 437. The printed circuit board 437 also mounts a display 438. The pair of mating plug-in type electrical connectors 439 removably connect the printed circuit board 437 and a printed circuit board 440. The printed circuit board 440 and another printed circuit board 441 are removably connected by a pair of mating plug-in type electrical connectors 442. A holder generally indicated at 443 includes a pair of holder members 444 and 445 joined by a connecting member 446. The holder has a generally U-shaped configuration and is molded of elastomeric material. The holder members 444 and 445 have vertically spaced grooves 447 and 447' for receiving marginal side portions of the respective printed circuit boards 440 and 441. The connecting member 446 resiliently connects the holder members 444 and 445. Each member 444 and 445 is joined to a respective flange 448 by a hinge 449. Screws 450 pass through holes 451 in the flanges 448 and through cutouts 452 in the printed circuit board 437 and are threadably received in the housing section 432. The holder 443 is thus suspended from the housing section 432 so that the members 444 and 445 can flex slightly upon impact relative to hinges 449 and relative to the connector 446. The printed circuit board 437 is pressed against the housing section 432 and the printed circuit board 440 and 441 are resiliently or cushion mounted against impact to the holder members 444 and 445. The resilient mounting of the printed circuit boards 440 and 441 makes it easier to connect the connectors 439 and 442 in spite of manufacturing variations. The housing section 432 has C-shaped members 453 (FIGS. 18 and 21) securely mounted to the tie rod 412 in closely straddled and contacting relation to the subframe 303. A tie rod 455 is aligned with holes 456 (FIG. 16) and passes through holes 457 in print head mounting member 458 and holes 459 in the housing section 432. The rod 455 also passes through holes 460 in the member 431 and wheels 461 of an applicator roll generally indicated at 462.

Figure 19:
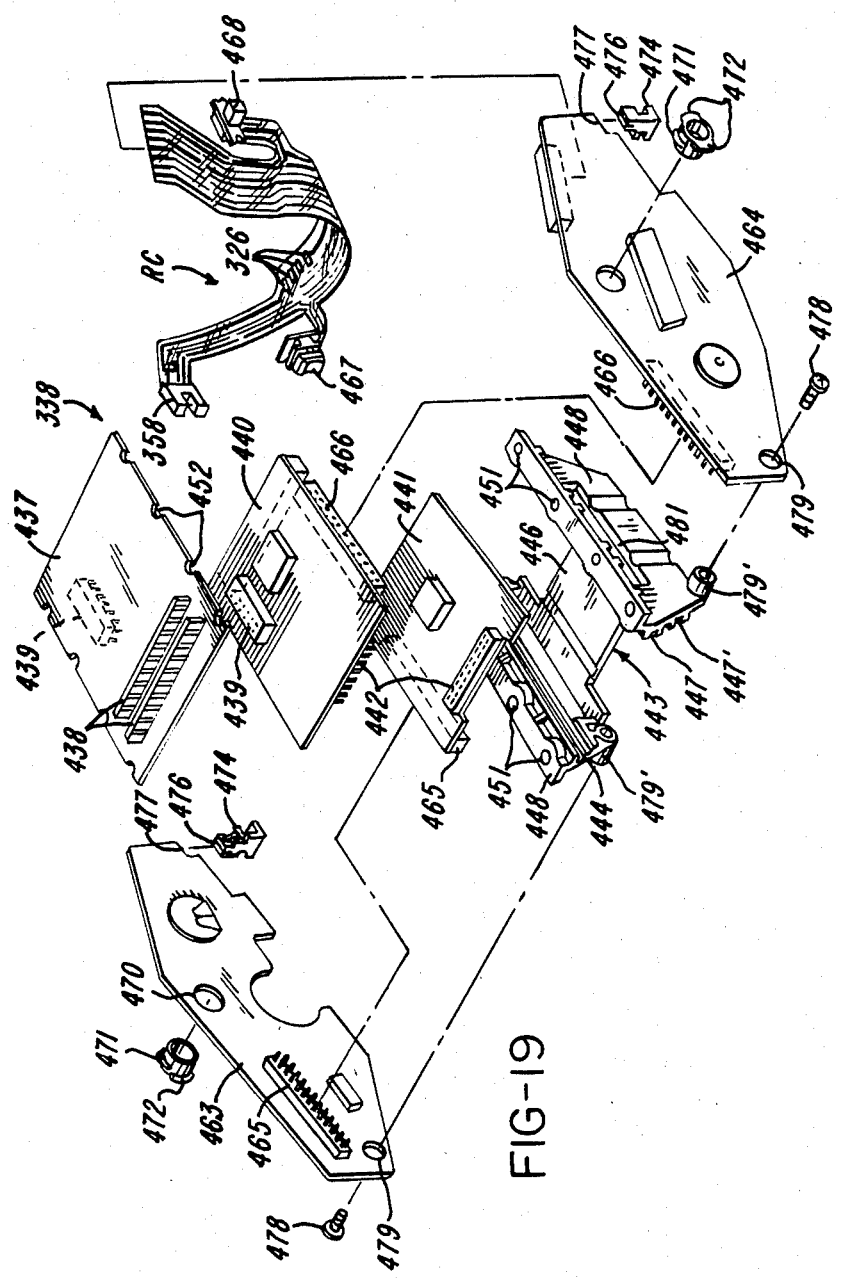
FIG. 19 is an exploded perspective view showing the arrangement of printed circuit boards.

With reference to FIG. 19, there are shown the printed circuit boards 437, 440 and 441, together with printed circuit boards 463 and 464 which comprise the circuitry 338. The printed circuit boards 441 and 463 are removably connected by mating plug-in type electrical connectors 465, and the printed circuit boards 440 and 464 are removably connected by means of plug-in type electrical connectors 466. A ribbon connector RC electrically connects contacts 326, the printed circuit board 464, a switch 467 which is manually operated each time it is desired to print and dispense a label L, an on-off switch 468 and the sensor 358.

As best shown in FIG. 21, the printed circuit board 463 is disposed between the housing section 304 and the subframe section 344 of the subframe 303 and the printed circuit board 464 is disposed between the housing section 305 and the subframe section 345 of the subframe 303. A bushing or grommet 469 molded of elastomeric material is received in a hole 470 in each printed circuit board 463 and 464 and in a recess in the members 453. The outer surface of each bushing 469 has a pair of opposite projections 471 which enable the bushing 469 to be snapped onto the respective printed circuit board 463 and 464. A pair of shoulders 472 retain the bushing 469 on the respective printed circuit board 463 and 464. With reference to FIG. 17, each subframe section 344 and 345 has a threaded projection 473 for mounting a molded bracket 474 composed of elastomeric material. A screw 475 secures each bracket 474 to the respective projections 473. The brackets 474 are identical and each has a channel or slot 476 for receiving a marginal edge 477 of the respective printed circuit board 463 and 464. A screw 478 passes into a projection 479' received in a hole 479 in each printed circuit board 463 and 464. The screws 478 spread the projections 479' to fill the holes 479 to resiliently mount the printed circuit boards 463 and 464 into holder members 444 and 445 and are threadably received in the respective elastomeric holder member 444 and 445. The holder member 444 (FIG. 23) has a slot 480 for receiving the electrical connectors 465, and the holder member 445 (FIGS. 19 and 23) has a slot 481 for receiving the electrical connectors 466. As is apparent, the printed circuit boards 463 and 464 are cushion mounted by the holder 443, by the bushings 469 and by the brackets 474.

With reference to FIG. 18, the print head 26 which is on the underside of the support 482 is connected to the printed circuit board by means of a plug-in end portion 483 of a ribbon connector 484. The position of the support 482 and hence the print head 26 can be adjusted by means of threaded blocks 486. Adjusting screws 487 adjust the support 482 relative to the print head mounting member 458.

A platen roller 488 has end portions 489 mounted in ball bearings 490 received in pockets 491 in mounting members 492. The mounting members 492 are pivotal on aligned posts 493 received in holes 494. Screws 495 hold the members 492 on the posts 493. Leaf springs 496 are received in respective pockets 497 (only one of which is shown) in members 492 and bear against aligned posts 498 (only one of which is shown). A delaminator in the form of a peel roller 499 is rotatably mounted in aligned notches 500.

The bottom member 431 is pivotal downwardly about the tie rod 455. The bottom member 431 is retained in its normal operational position by teeth 511 engaged on upper surfaces of the guidways 502. A pair of actuators 501 is mounted to the print head mounting member 458. A pair of guideways 502 mount the actuators 501. The actuators 501 include flexible resilient arms 503 which bias the actuators 501 outwardly. Each actuator 501 has a projection 504 aligned with a pad 505 at free end of a leaf spring 506. Each leaf spring 506 is cantilevered to a respective outwardly extending member 507 on the member 431. Button 508 projects outwardly through the notch 509. When the buttons 508 are simultaneously pressed inwardly, projections 504 are simultaneously pressed inwardly and contact the pad 505 and cause the leaf springs 506 to deflect inwardly. The member 431 is then able to be pulled downwardly by grasping finger engageable members 510. The pad 505 catches on the ledge 512. The labeler 299 can now be threaded because the platen roll 488 is now spaced from the print head 26. In order to further lower the bottom member 431 to a fully open position as when it is desired to clean the print head 26, the buttons 508 are pressed inwardly with greater force and the underside of the pad 505 catches on ledge 512. The bottom member 431 can now be pivoted through at least 75°. When the bottom member 431 has been lowered, transverse portion 430' of the guide 421 can be manually deflected (moved to the left in FIG. 22) away from the lug 429. The guide 421 can now be slid downwardly to provide access for cleaning purposes.

Other embodiments and modifications of the invention will suggest themselves to those skilled in the art, and all such of these as come within the spirit of this invention are included within its scope as best defined by the appended claims.

We claim:

1. A hand-held labeler adapted to print and apply pressure sensitive labels releasably secured to a carrier web, comprising: a housing having spaced wall members and a handle, means in the housing for advancing a carrier web, means for printing on labels including a print head having electrically selectable printing elements, means for delaminating printed labels, means for applying printed labels, means defining a path for guiding the web from a label supply roll to the printing means, to the delaminating means and to the web advancing means, a keyboard, circuitry for electrically connecting the keyboard and the print head, the circuitry including a first printed circuit board extending generally horizontally between the wall members and a second printed circuit board extending generally vertically, a plug-type connection connecting the first and second printed circuit boards, and means for resiliently mounting the first and second circuit boards within the housing.

2. A hand-held labeler as defined in claim 1, wherein there are a plurality of printed circuit boards disposed inside and spaced from the housing, and plug-type connectors connecting the printed circuit boards to each other.

3. A hand-held labeler as defined in claim 1, a subframe inside the housing, the print head being mounted to the subframe, wherein the printed circuit board is mounted to the subframe by the resilient mounting means at a plurality of spaced locations.

4. A hand-held labeler as defined in claim 3, wherein the mounting means includes an elastomeric bushing received in an opening in the printed circuit board, the housing including a housing section in contact with the bushing, an elastomeric bracket secured to the subframe and having a channel for receiving a marginal edge portion of the printed circuit board, an elastomeric member secured to the housing and a fastener for securing the printed circuit board to the elastomeric member.

5. A hand-held labeler adapted to print and apply pressure sensitive labels releasably secured to a carrier web, comprising: a housing having spaced wall members and a handle, means in the housing for advancing a carrier web, means for printing on labels including a print head having electrically selectable printing elements, means for delaminating printed labels, means for applying printed labels, means defining a path for guiding the web from a label supply roll to the printing means, to the delaminating means and to the web advancing means, a keyboard, circuitry for electrically connecting the keyboard and the print head, circuitry including a printed circuit board spaced from the housing, and means for resiliently mounting the printed circuit board inside and in spaced relationship with respect to the housing.

6. A hand-held labeler adapted to print and apply pressure sensitive labels releasably secured to a carrier web, comprising: a housing having spaced wall members and a handle, means in the housing for advancing a carrier web, means for printing on labels including a print head having electrically selectable printing elements, means for delaminating printed labels, means for applying printed labels, means defining a path for guiding the web from a label supply roll to the printing means, to the delaminating means and to the web advancing means, a keyboard, circuitry for electrically connecting the keyboard and the print head, the circuitry including a plurality of printed circuit boards, a generally U-shaped holder having spaced holder members and a connecting member, and means on the holder members for holding the printed circuit boards in spaced face-to-face oriented relationship with respect to each other.

7. A hand-held labeler as defined in claim 6, wherein the holder is composed of resilient material.

8. A hand-held labeler as defined in claim 6, wherein the holder is of one-piece molded construction.

9. A hand-held labeler as defined in claim 6, wherein the holder is of one-piece molded elastomeric material construction.

10. A hand-held labeler adapted to print and apply pressure sensitive labels releasably secured to a carrier web, comprising: a housing having spaced wall members and a handle, means in the housing for advancing a carrier web, means for printing on labels including a print head having electrically selectable printing elements, means for delaminating printed labels, means for applying printed labels, means defining a path for guiding the web from a label supply roll to the printing means, to the delaminating means and to the web advancing means, a keyboard, circuitry for electrically connecting the keyboard and the print head, the circuitry including first and second printed circuit boards, a resilient holder for mounting the printed circuit board, wherein the holder has an aperture, and a plug-type connector extending through the opening for connecting the first and second circuit boards.

11. A hand-held labeler adapted to print and apply pressure sensitive labels releasably secured to a carrier web, comprising: a housing having spaced wall members and a handle, means in the housing for advancing a carrier web, means for printing on labels including a print head having electrically selectable printing elements, means for delaminating printed labels, means for applying printed labels, means defining a path for guiding the web from a label supply roll to the printing means, to the delaminating means and to the web advancing means, a keyboard, circuitry for electrically connecting the keyboard and the print head, a subframe disposed inside the frame, the print head being mounted on the subframe, the circuitry including a printed circuit board, means for resiliently connecting the printed circuit board to the housing, and means for connecting the printed circuit board to the subframe.

12. A hand-held labeler as defined in claim 11, wherein the means for connecting the printed circuit board to the subframe includes a resilient connection.

13. A hand-held labeler adapted to print and apply pressure sensitive labels releasably secured to a carrier web, comprising: a housing having spaced wall members and a handle, means in the housing for advancing a carrier web, means for printing on labels including a print head having electrically selectable printing elements, means for delaminating printed labels, means for applying printed labels, means defining a path for guiding the web from a label supply roll to the printing means, to the delaminating means and to the web advancing means, a keyboard, circuitry for electrically connecting the keyboard and the print head, the circuitry including a printed circuit board, a holder inside the housing, the holder including a pair of spaced holder members for holding marginal side edges of the printed circuit board, and a resilient connector connecting the holder members to each other.

14. A hand-held labeler as defined in claim 13, wherein the holder members are resilient, and means for securing the holder members to the housing.

15. A hand-held labeler adapted to print and apply pressure sensitive labels releasably secured to a carrier web, comprising: a housing having spaced wall members and a handle, means in the housing for advancing a carrier web, means for printing on labels including a print head having electrically selectable printing elements, means for delaminating printed labels, means for applying printed labels, means defining a path for guiding the web from a label supply roll to the printing means, to the delaminating means and to the web advancing means, a keyboard, circuitry for electrically connecting the keyboard and the print head, the circuitry including a printed circuit board disposed within the housing, a printed circuit board holder having a pair of spaced holder members for holding opposite marginal side edges of the printed circuit board, the holder members being constructed of elastomeric material, means for suspending each holder member from the housing to protect the printed circuit board against impact applied to the labeler.

16. A hand-held labeler adapted to print and apply pressure sensitive labels releasably secured to a carrier web, comprising: a housing having spaced wall members and a handle, means in the housing for advancing a carrier web, means for printing on labels including a print head having electrically selectable printing elements, means for delaminating printed labels, means for applying printed labels, means defining a path for guiding the web from a label supply roll to the printing means, to the delaminating means and to the web advancing means, a keyboard, circuitry for electrically connecting the keyboard and the print head, the circuitry including a printed circuit board disposed within the housing, a pair of spaced holder members in the housing for mounting the printed circuit board, and means for hingedly mounting each holder member.

17. A hand-held labeler as defined in claim 16, a flange on each holder member, each flange being connected to the housing, and each hinged mounting means connects a holder member and its respective flange.

18. A hand-held labeler as defined in claim 16, a flange on each holder member, wherein the keyboard includes a printed circuit board, wherein marginal side edges of the keyboard printed circuit board are disposed between the housing and the flanges, and fasteners extending through the flanges and the marginal side edges for holding the flanges and the keyboard printed circuit board to the housing.

19. A hand-held labeler adapted to print and apply pressure sensitive labels releasably secured to a carrier web, comprising: a housing having spaced wall members and a handle, means in the housing for advancing a carrier web, means for printing on labels including a print head having electrically selectable printing elements, means for delaminating printed labels, means for applying printed labels, means defining a path for guiding the web from a label supply roll to the printing means, to the delaminating means and to the web advancing means, a keyboard, circuitry for electrically connecting the keyboard and the print head, the circuitry including a plurality of printed circuit boards disposed within the housing, spaced members having a plurality of sets of holding means for receiving opposite marginal side edges of the printed circuit boards in spaced face-to-face orientation, and wherein the holding means are resilient for resiliently mounting the printed circuit boards.

20. A hand-held labeler adapted to print and apply pressure sensitive labels releasably secured to a carrier web, comprising: a housing having spaced wall members and a handle, means in the housing for advancing a carrier web, means for printing on labels including a print head having electrically selectable printing elements, means for delaminating printed labels, means for applying printed labels, means defining a path for guiding the web from a label supply roll to the printing means, to the delaminating means and to the web advancing means, a keyboard, circuitry for electrically connecting the keyboard and the print head, the circuitry including a printed circuit board, a resilient holder for mounting the printed circuit board, the holder including a pair of spaced holder members for holding the printed circuit board, each holder member having a flange, means for securing the flanges to the housing, the circuitry including another printed circuit board, and plug-in type connectors connecting the printed circuit boards to each other.

* * * * *